United States Patent
Jang et al.

(10) Patent No.: US 12,419,034 B2
(45) Date of Patent: Sep. 16, 2025

(54) VERTICAL GATE ALL AROUND TRANSISTOR HAVING DUAL GATE STRUCTURES

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Kyongtaek Lee, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 497 days.

(21) Appl. No.: 17/950,212

(22) Filed: Sep. 22, 2022

(65) Prior Publication Data
US 2023/0021017 A1   Jan. 19, 2023

Related U.S. Application Data

(63) Continuation of application No. PCT/CN2022/101185, filed on Jun. 24, 2022.

(30) Foreign Application Priority Data

Jun. 8, 2022   (CN) ................. 202210645117.X

(51) Int. Cl.
*H10B 12/00*   (2023.01)
*H10D 30/01*   (2025.01)
(Continued)

(52) U.S. Cl.
CPC ............ *H10B 12/30* (2023.02); *H10B 12/05* (2023.02); *H10D 30/023* (2025.01);
(Continued)

(58) Field of Classification Search
CPC .. H10D 30/023; H10D 30/025; H10D 30/611; H10D 30/63; H10D 64/512;
(Continued)

(56) References Cited

U.S. PATENT DOCUMENTS

| 5,244,824 A | 9/1993 | Sivan |
|---|---|---|
| 6,376,303 B1 | 4/2002 | Seo |

(Continued)

FOREIGN PATENT DOCUMENTS

| CN | 101017825 A | 8/2007 |
|---|---|---|
| CN | 101740500 A | 6/2010 |

(Continued)

*Primary Examiner* — Yara B Green
*Assistant Examiner* — Christopher M Roland
(74) *Attorney, Agent, or Firm* — SYNCODA LLC; Feng Ma

(57) ABSTRACT

A semiconductor structure and a method for manufacturing the same are provided. The semiconductor structure includes: a substrate, a dielectric layer, a first gate structure and a second gate structure. The substrate includes discrete semiconductors arranged at a top of the substrate and extending in a vertical direction. The first gate structure is arranged in a first region of the semiconductor pillar and surrounds the semiconductor pillar. The second gate structure is arranged in a second region of the semiconductor pillar and includes a ring structure and at least one bridge structure. The ring structure surrounds the semiconductor pillar, and the at least one bridge structure penetrates through the semiconductor pillar and extends to an inner wall of the ring structure in a penetrating direction. The dielectric layer is located between the first gate structure and the semiconductor pillar, and between the second gate structure and the semiconductor pillar.

20 Claims, 19 Drawing Sheets

(51) Int. Cl.
  *H10D 30/60* (2025.01)
  *H10D 30/63* (2025.01)
  *H10D 64/27* (2025.01)
  *H10D 84/01* (2025.01)
  *H10D 84/83* (2025.01)

(52) U.S. Cl.
  CPC ......... *H10D 30/025* (2025.01); *H10D 30/611* (2025.01); *H10D 30/63* (2025.01); *H10D 64/512* (2025.01); *H10D 64/516* (2025.01); *H10D 84/0142* (2025.01); *H10D 84/0144* (2025.01); *H10D 84/016* (2025.01); *H10D 84/837* (2025.01)

(58) Field of Classification Search
  CPC ............. H10D 64/516; H10D 84/0142; H10D 84/0144; H10D 84/016; H10D 84/837; H10B 12/05; H10B 12/30
  See application file for complete search history.

(56) References Cited

U.S. PATENT DOCUMENTS

| | | | |
|---|---|---|---|
| 9,673,257 B1 | 6/2017 | Takaki | |
| 2006/0043471 A1 | 3/2006 | Tang | |
| 2006/0046391 A1 | 3/2006 | Tang | |
| 2007/0020819 A1 | 1/2007 | Tang | |
| 2007/0048943 A1 | 3/2007 | Tang | |
| 2007/0181925 A1 | 8/2007 | Yoon et al. | |
| 2007/0224753 A1 | 9/2007 | Tang | |
| 2008/0251825 A1* | 10/2008 | Lee ........................ | H10D 30/63 257/E29.264 |
| 2009/0072291 A1 | 3/2009 | Takaishi | |
| 2009/0207649 A1 | 8/2009 | Tang | |
| 2010/0120221 A1 | 5/2010 | Kang | |
| 2010/0213525 A1 | 8/2010 | Masuoka | |
| 2011/0104862 A1 | 5/2011 | Kadoya | |
| 2011/0171796 A1 | 7/2011 | Tang | |
| 2013/0011987 A1 | 1/2013 | Park | |
| 2013/0056698 A1 | 3/2013 | Satoh | |
| 2013/0075813 A1 | 3/2013 | Kadoya | |
| 2015/0017767 A1 | 1/2015 | Masuoka et al. | |
| 2015/0380548 A1 | 12/2015 | Wang et al. | |
| 2016/0204251 A1 | 7/2016 | Masuoka et al. | |
| 2017/0179144 A1* | 6/2017 | Han ................... | H01L 23/53257 |
| 2017/0271510 A1 | 9/2017 | Wang et al. | |
| 2017/0309632 A1 | 10/2017 | Masuoka et al. | |
| 2017/0323977 A1 | 11/2017 | Cheng et al. | |
| 2018/0083136 A1 | 3/2018 | Xie et al. | |
| 2018/0096896 A1 | 4/2018 | Zhu | |
| 2018/0175212 A1 | 6/2018 | Cheng et al. | |
| 2019/0027570 A1 | 1/2019 | Ching et al. | |
| 2019/0115438 A1 | 4/2019 | Ching et al. | |
| 2019/0123053 A1 | 4/2019 | Masuoka et al. | |
| 2019/0237581 A1 | 8/2019 | Saito et al. | |
| 2019/0326395 A1 | 10/2019 | Ando et al. | |
| 2020/0020812 A1 | 1/2020 | Masuoka et al. | |
| 2020/0052084 A1 | 2/2020 | Ching et al. | |
| 2021/0305431 A1 | 9/2021 | Ishimaru et al. | |
| 2022/0069070 A1 | 3/2022 | Lai et al. | |
| 2022/0102347 A1 | 3/2022 | Lai et al. | |
| 2022/0139918 A1 | 5/2022 | Lee | |
| 2022/0139920 A1 | 5/2022 | Lee | |
| 2022/0199837 A1 | 6/2022 | Masuoka et al. | |
| 2022/0262954 A1 | 8/2022 | Ishimaru et al. | |
| 2023/0014884 A1* | 1/2023 | Jang .................... | H10B 12/0335 |
| 2023/0016938 A1* | 1/2023 | Jang .................... | H10D 64/513 |
| 2023/0017651 A1* | 1/2023 | Jang .................... | G11C 5/063 |
| 2023/0019926 A1* | 1/2023 | Jang .................... | H10B 12/315 |
| 2023/0021074 A1* | 1/2023 | Jang .................... | H10D 64/017 |
| 2023/0345694 A1* | 10/2023 | Jang .................... | H10B 12/00 |

FOREIGN PATENT DOCUMENTS

| | | |
|---|---|---|
| CN | 101933135 A | 12/2010 |
| CN | 102867752 A | 1/2013 |
| CN | 105280698 A | 1/2016 |
| CN | 106252352 A | 12/2016 |
| CN | 107845578 A | 3/2018 |
| CN | 110476230 A | 11/2019 |
| CN | 110931429 A | 3/2020 |
| CN | 113078155 A | 7/2021 |
| CN | 113078156 A | 7/2021 |
| CN | 113451405 A | 9/2021 |
| CN | 114464535 A | 5/2022 |
| CN | 114497039 A | 5/2022 |
| EP | 1804286 A1 | 7/2007 |
| WO | 2013033267 A1 | 3/2013 |

* cited by examiner

VERTICAL GATE ALL AROUND TRANSISTOR HAVING DUAL GATE STRUCTURES

CROSS-REFERENCE TO RELATED APPLICATION

This is a continuation of International Patent Application No. PCT/CN2022/101185, filed on Jun. 24, 2022, which claims priority to Chinese Patent Application No. 202210645117.X, filed on Jun. 8, 2022. The disclosures of International Patent Application No. PCT/CN2022/101185 and Chinese Patent Application No. 202210645117.X are hereby incorporated by reference in their entireties.

BACKGROUND

As the integration density of a dynamic memory develops to be higher, the arrangement mode of transistors in a dynamic memory array structure and how to reduce the size of a single functional device in the dynamic memory array structure are researched, and the electrical performance of the small-size functional device needs to be improved.

Higher density efficiency may be achieved when a Vertical Gate All Around (VGAA) transistor structure is used as an access transistor of the dynamic memory. However, in the related art, the control ability of the gate of the access transistor is insufficient, so that the performance of the semiconductor structure is affected.

SUMMARY

The present disclosure relates, but is not limited, to a semiconductor structure and a method for manufacturing the same.

According to a first aspect of the embodiments of the present disclosure, there is provided a semiconductor structure, which includes: a substrate, a dielectric layer, a first gate structure, and a second gate structure.

The substrate includes discrete semiconductor pillars arranged at a top of the substrate and extending in a vertical direction, the semiconductor pillar including a first region and a second region.

The dielectric layer covers the semiconductor pillar.

The first gate structure is arranged in the first region of the semiconductor pillar and surrounds the semiconductor pillar. A first part of the dielectric layer is located between the first gate structure and the semiconductor pillar.

The second gate structure is arranged in the second region of the semiconductor pillar and includes a ring structure and at least one bridge structure. The ring structure surrounds the semiconductor pillar, and the at least one bridge structure penetrates through the semiconductor pillar and extends to an inner wall of the ring structure in a penetrating direction. A second part of the dielectric layer is located between the second gate structure and the semiconductor pillar.

According to a second aspect of the embodiments of the present disclosure, there is provided a method for manufacturing a semiconductor structure, which may include the following operations. A substrate including discrete semiconductors arranged at a top of the substrate and extending in a vertical direction is provided, the semiconductor pillar including a first region and a second region. A first part of a dielectric layer is formed. A first gate structure surrounding the semiconductor pillar is formed in the first region of the semiconductor pillar, where the first part of the dielectric layer is located between the first gate structure and the semiconductor pillar. A second part of the dielectric layer is formed. A second gate structure including a ring structure and at least one bridge structure is formed in the second region of the semiconductor pillar. Herein, the ring structure surrounds the semiconductor pillar, and the at least one bridge structure penetrates through the semiconductor pillar and extends to an inner wall of the ring structure in a penetrating direction. The second part of the dielectric layer is located between the second gate structure and the semiconductor pillar.

DETAILED DESCRIPTION

In order to make the purposes, technical solutions and advantages of the present disclosure clearer, the technical solutions of the present disclosure are further described in details below in combination with the accompanying drawings and the embodiments. The described embodiments should not be regarded as limitations of the present disclosure. All other embodiments obtained by those of ordinary skill in the art without creative work shall fall within the scope of protection of the present disclosure.

The following description involves "some embodiments" which describe a subset of all possible embodiments, but it is to be understood that "some embodiments" may be the same or a different subset of all possible embodiments, and may be combined with each other without conflict.

If a similar description of "first/second" appears in the application document, the following description will be added. In the following description, the involved terms "first/second/third" are only used to distinguish similar objects, and do not represent a specific order of the objects. It is to be understood that the specific order or sequence of "first/second/third" may be interchangeable under the allowable circumstances, so that the embodiments of the present disclosure described herein may be implemented in an order other than those illustrated or described herein.

Unless otherwise defined, all technical and scientific terms used herein have the same meaning as that commonly understood by those skilled in the art of the present disclosure. The terms used herein is only for the purpose of describing the embodiments of the present disclosure and is not intended to limit the present disclosure.

Figure 1:
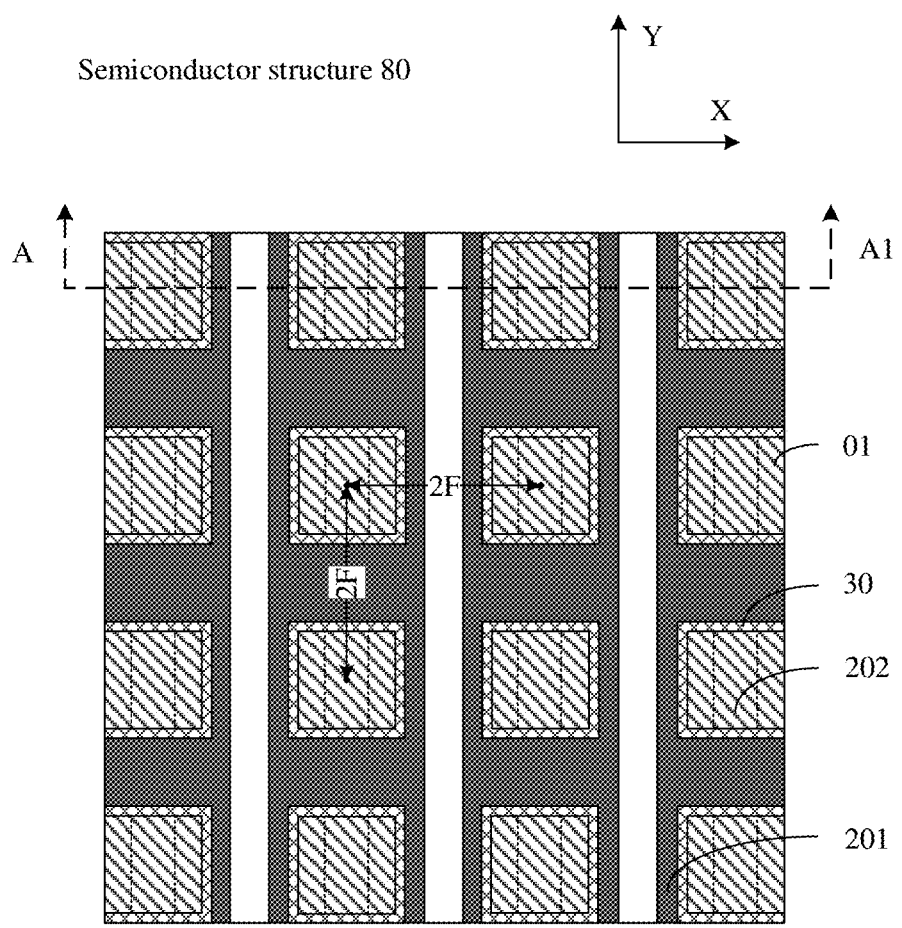
FIG. 1 is a first schematic diagram of a semiconductor structure provided by an embodiment of the present disclosure.
Figure 2:
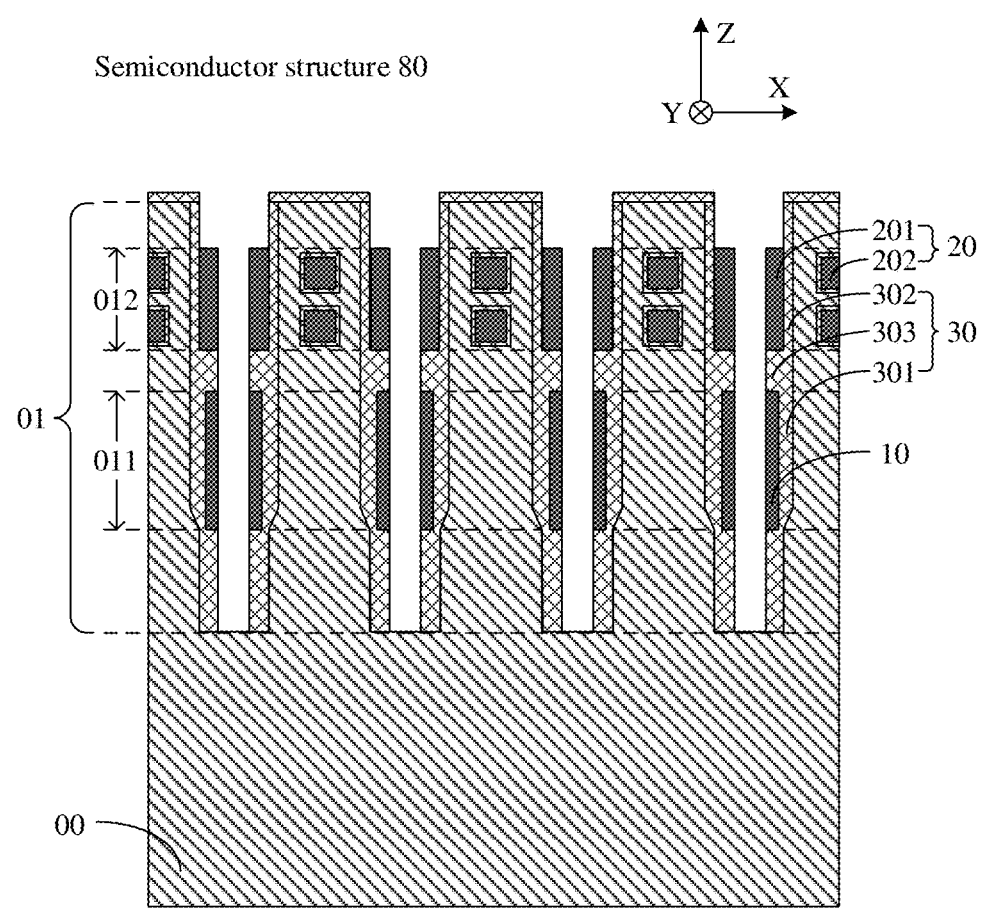
FIG. 2 is a second schematic diagram of a semiconductor structure provided by an embodiment of the present disclosure.

FIG. 1 and FIG. 2 are optional schematic structural diagrams of a semiconductor structure provided by an embodiment of the present disclosure, FIG. 1 is a top view, and FIG. 2 is a cross-sectional view taken in a cross-sectional line A-A1 in FIG. 1. It is to be noted that, a bit line structure is not shown in FIG. 1.

As shown in FIG. 1 and FIG. 2, the semiconductor structure 80 includes: a substrate 00, a first gate structure 10, a second gate structure 20 and a dielectric layer 30.

The substrate 00 includes discrete semiconductor pillars/channels 01. The semiconductor pillars 01 are arranged at a top of the substrate 00 and extend in a vertical direction Z. The semiconductor pillar 01 includes a first region 011 and a second region 012.

The dielectric layer 30 covers the semiconductor pillar 01.

The first gate structure 10 is arranged in the first region 011 of the semiconductor pillar 01 and surrounds the semiconductor pillar 01. A first part 301 of the dielectric layer 30 is located between the first gate structure 10 and the semiconductor pillar 01.

The second gate structure 20 is arranged in the second region 012 of the semiconductor pillar 01 and includes a ring structure 201 and at least one bridge structure 202. The ring structure 201 surrounds the semiconductor pillar 01, and the at least one bridge structure 202 penetrates through the semiconductor pillar 01 and extends to an inner wall of the ring structure 201 in a penetrating direction. A second part 302 of the dielectric layer 30 is located between the second gate structure 20 and the semiconductor pillar 01.

It is to be noted that, a first direction X and a second direction Y shown in FIG. 1 are both perpendicular to a vertical direction Z shown in FIG. 2. The first direction X and the second direction Y may be perpendicular to each other, and may also be at any included angle, and the following is exemplarily illustrated in a case where the first direction X is perpendicular to the second direction Y.

In the embodiment of the present disclosure, the substrate 00 may include at least one of semiconductor materials, for example, group IV elements such as silicon (Si), germanium (Ge), and silicon germanium (SiGe), or group III-V compounds such as gallium arsenide (GaAs), aluminum gallium arsenide (AlGaAs), indium arsenide (InAs), or indium gallium arsenide (InGaAs), and the following is exemplarily illustrated with the silicon element included in the substrate 00.

The semiconductor pillar 01 may have a doping element to improve the conductivity of the semiconductor pillar 01. Herein, the doping element may be a P-type doping element or an N-type doping element, and the N-type doping element may be at least one of an arsenic (As) element, a phosphorus (P) element, or an antimony (Sb) element. The P-type doping element may be at least one of a boron (B) element, an indium (In) element, or a gallium (Ga) element.

The material for forming the first gate structure 10 and the second gate structure 20 may be titanium nitride (TiN), or at least one of conductive materials such as tantalum nitride (TaN), copper (Cu), or tungsten (W), and the following is exemplarily illustrated with titanium nitride. The material for forming the dielectric layer 30 may be silicon oxide (SiO).

In the embodiment of the present disclosure, the semiconductor pillar 01, the first gate structure 10 and the first part 301 of the dielectric layer 30 may jointly constitute a first transistor, the semiconductor pillar 01, the second gate structure 20 and the second part 302 of the dielectric layer 30 may jointly constitute a second transistor. Herein, each of the first region 011 and the second region 012 of the semiconductor pillar 01 forms a channel, other region of the semiconductor pillar 01 forms a source or drain, the first gate structure 10 is used as a gate of the first transistor, and the second gate structure 20 is used as a gate of the second transistor.

The first transistor and the second transistor are both VGAA transistors, that is, the channel formed by the semiconductor pillar 01 extends in the vertical direction Z, each of the first gate structure 10 and the ring structure 201 of the second gate structure 20 surrounds the channel. Therefore, under the same size, compared with the transistor structures such as a Fin Field-Effect Transistor (FinFET), etc., the gate of the first transistor and of the second transistor may more sufficiently cover the channel, so that the control ability of the gate is stronger.

In the embodiment of the present disclosure, referring to FIG. 1, in an overlooking angle, the size of the semiconductor pillar 01 satisfies $4F^2$ (F is the minimum pattern size obtainable under given process conditions), that is, the distance between the center points of the two adjacent first semiconductor pillars 01 in the first direction X is 2F, at the same time, the distance between the center points of the two adjacent first semiconductor pillars 01 in the second direction Y is also 2F. Therefore, the integration density of the semiconductor structure 80 is improved. In some embodiments, when a storage unit is formed on the semiconductor pillar 01, the storage unit may also be arranged according to $4F^2$.

In the embodiment of the present disclosure, in combination with FIG. 1 and FIG. 2, the bridge structure 202 of the second gate structure 20 penetrates through the semiconductor pillar 01 and extends to the inner wall of the ring structure 201 in the penetrating direction (i.e. the second direction Y), the semiconductor pillar 01 is penetrated to form a through hole, which is filled with the bridge structure 202, that is, the inner wall of the through hole is covered with the bridge structure 202. In this way, the bridge structure 202 covers part of the channel, the coverage area of the channel by the second gate structure 20 is increased, and the is more easily controlled, thereby further improving the control ability of the gate of the second transistor.

It is understandable that, the semiconductor pillar 01 and the first gate structure 10 may form the first transistor, and the semiconductor pillar 01 and the second gate structure 20 may form the second transistor. The first transistor and the second transistor may be used as the access transistors, that is, the gate of the first transistor and the gate of the second transistor may both receive the control signals, and the control ability of the gates of the two transistors on the semiconductor pillar 01 may remedy each other. For example, if the gate of one transistor fails to turn off the semiconductor pillar 01 completely, the gate of the other transistor may remedy it, so that the semiconductor pillar 01 may be turned off, thereby reducing the leakage current in the semiconductor pillar 01, and improving the overall electrical performance of the semiconductor structure 80.

At the same time, the second gate structure 20 includes the ring structure 201 surrounding the semiconductor pillar 01 and the bridge structure 202 penetrating through the semiconductor pillar 01. The coverage area of the semiconductor pillar 01 by the second gate structure 20 is increased, and the control ability of the gate of the second transistor on the semiconductor pillar 01 is improved, thereby improving the overall electrical performance of the semiconductor structure 80.

In some embodiments of the present disclosure, as shown in FIG. 2, a length of the ring structure 201 in the vertical direction Z is smaller than a length of the first gate structure 10 in the vertical direction Z.

It is understandable that, on the one hand, the length of the first gate structure 10 in the vertical direction Z may be set to be longer, and then the coverage area of the channel by the first gate structure 10 is increased, so that the control ability of the gate of the first transistor is improved.

On the other hand, the second gate structure 20 includes at least one of lanthanide elements and/or a zirconium element, which is beneficial to improve the electrical performance of the second gate structure 20, thereby improving the control ability of the second gate structure 20 on the semiconductor pillar 01. When a length of the second gate structure 20 is smaller than the length of the first gate structure 10, the conductivity of the second gate structure 20 is improved by doping at least one of the lanthanide elements and/or the zirconium element in the second gate structure 20, so that the difference in conductivity between the first gate structure 10 and the second gate structure 20 due to the size difference may be made up, and the difference between the control ability of the first gate structure 10 and of the second gate structure 20 on the semiconductor pillar 01 is improved, thereby improving the overall stability of the semiconductor structure 80.

In some embodiments of the present disclosure, as shown in FIG. 2, a thickness of the ring structure 201 in the second region 012 is greater than a thickness of the first gate structure 10 in the first region 011, and a thickness of the first part 301 of the dielectric layer 30 is greater than a thickness of the second part 302 of the dielectric layer 30. The thicknesses may be the thickness in the first direction X.

It is understandable that, the ring structure 201 may be set to be thicker in the second region 012, so that the resistance of the ring structure 201 may be reduced, and the voltage loss of the gate of the second transistor is reduced, thereby further improving the control ability of the gate of the second transistor. Correspondingly, the second part 302 of the dielectric layer 30 located between the ring structure 201 and the semiconductor pillar 01 may be set to be thinner, which is beneficial to reduce the gate threshold voltage of the second transistor, thereby further improving the control ability of the gate of the second transistor.

At the same time, the first gate structure 10 is set to be relatively thin, and the area of the first gate structure facing the ring structure 201 is relatively small, that is, the area of an electrode plate of a parasitic capacitance between the first gate structure 10 and the ring structure 201 is relatively small, so that the parasitic capacitance between the first gate structure 10 and the ring structure 201 is reduced.

In some embodiments of the present disclosure, as shown in FIG. 2, the second region 012 is located above the first region 011, and a top of the ring structure 201 is lower than a top of the semiconductor pillar 01. It is understandable that, the top of the ring structure 201 is lower than the top of the semiconductor pillar 01, that is, the top of the semiconductor pillar 01 is not covered by the ring structure 201. In this way, when a capacitor contact hole is formed at the top of the semiconductor pillar 01, a formed insulating covering layer may protect the ring structure 201, and at the same time, the contact area between the capacitor and the semiconductor pillar 01 is increased, thereby reducing the contact resistance.

In some embodiments of the present disclosure, as shown in FIG. 2, the dielectric layer 30 further includes a third part 303. The third part 303 of the dielectric layer 30 is located between the first part 301 of the dielectric layer 30 and the second part 302 of the dielectric layer 30, and a thickness of the third part 303 of the dielectric layer 30 is greater than the thickness of the first part 301 of the dielectric layer 30. The third part 303 of the dielectric layer 30 may isolate the first gate structure 10 and the second gate structure 20 on the same semiconductor pillar 01.

In some embodiments of the present disclosure, as shown in FIG. 2, the second gate structure 20 includes at least two bridge structures 202. The at least two bridge structures 202 are stacked in the vertical direction Z. It is understandable that, each bridge structure 202 covers an inner wall of one through hole in the semiconductor pillar 01, that is, covers part of the channel, and the coverage area of the pillar may be increased using the at least two bridge structures 202, thereby further improving the control ability of the gate of the second transistor.

In some embodiments of the present disclosure, as shown in FIG. 2, a width of each of the at least two bridge structures 202 is smaller than a width of the semiconductor pillar 01. The semiconductor pillar 01 is crossed by the bridge structure 202, and the bridge structure 202 covers the inner wall of the through hole, so that the contact area between the second gate structure 20 and the semiconductor pillar 01 is increased, and the length of the channel corresponding to the second gate structure 20 is also increased. Therefore, the control ability of the second gate structure 20 on the semiconductor pillar 01 is improved, and the contact resistance between the second gate structure 20 and the semiconductor pillar 01 is reduced.

Figure 3:
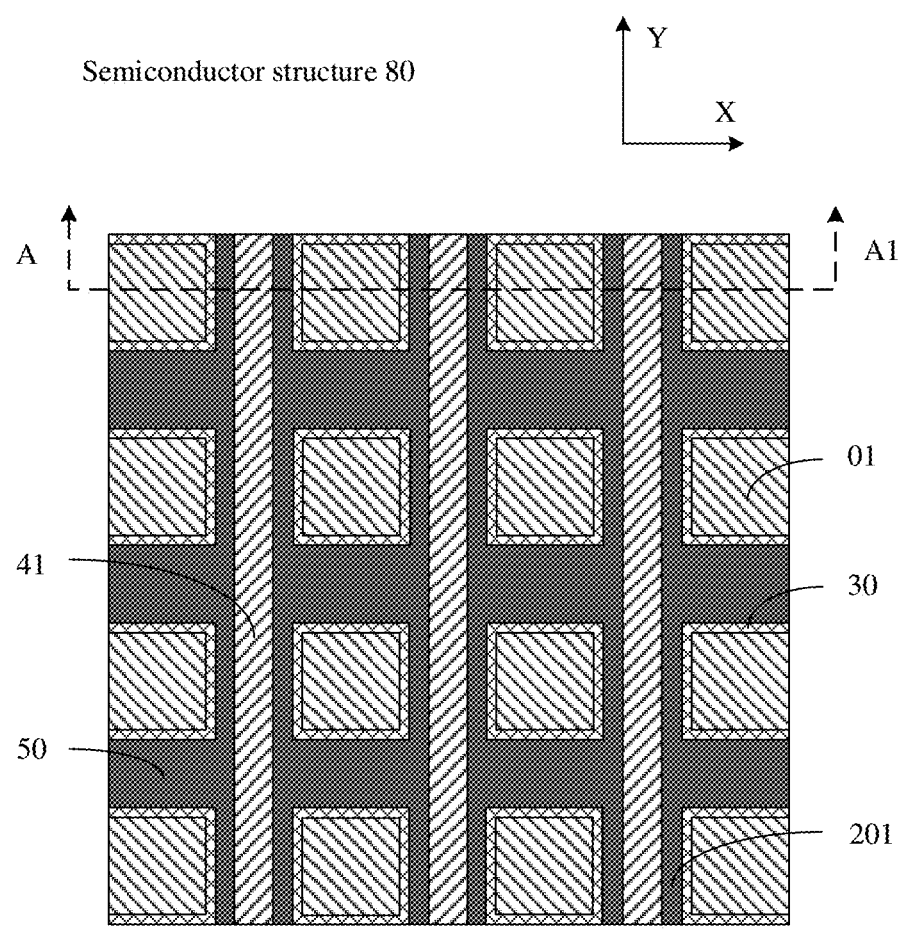
FIG. 3 is a third schematic diagram of a semiconductor structure provided by an embodiment of the present disclosure.
Figure 4:
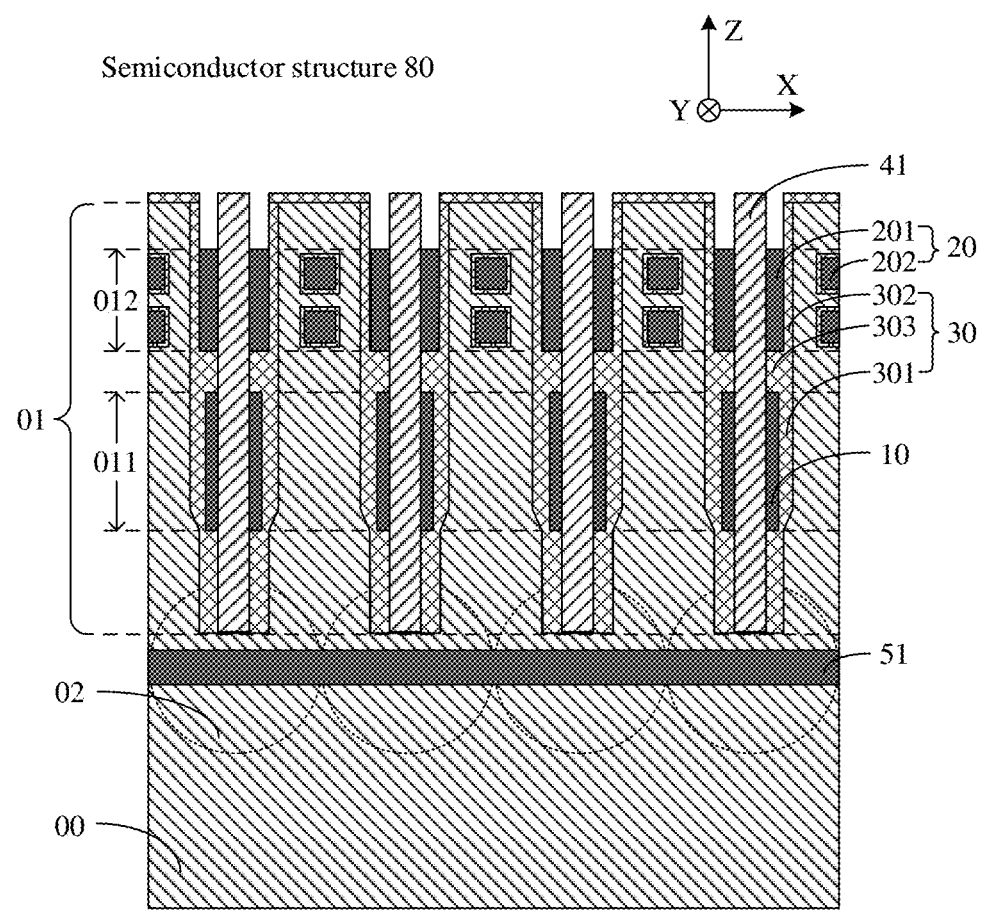
FIG. 4 is a fourth schematic diagram of a semiconductor structure provided by an embodiment of the present disclosure.

FIG. 3 and FIG. 4 are optional schematic structural diagrams of a semiconductor structure provided by an embodiment of the present disclosure, FIG. 3 is a top view, and FIG. 4 is a cross-sectional view taken in a cross-sectional line A-A1 in FIG. 3.

In some embodiments of the present disclosure, as shown in FIG. 3 and FIG. 4, the semiconductor structure 80 further includes a first isolation layer 41. The first isolation layer 41 is located between the adjacent first semiconductor pillars 01, and the first gate structure 10 and the second gate structure 20 are located between the first isolation layer 41 and the semiconductor pillar 01.

In the embodiment of the present disclosure, the first isolation layer 41 extends in the second direction Y to isolate the adjacent semiconductor pillars 01. In addition, the first gate structures 10 arranged in the second direction Y and the second gate structures 20 arranged in the second direction Y are respectively connected in series by a word line 50 extending in the second direction Y. The first gate structures 10 are connected in series by a first part of the word line 50, the second gate structures 20 are connected in series by a second part of the word line 50 (not shown in FIG. 3 due to being shaded), and the first isolation layer 41 is also configured to isolate the adjacent word lines 50. The material for forming the first isolation layer 41 may be silicon nitride (SiN).

It is understandable that, since the first gate structures 10 and the second gate structures 20 are respectively connected in series by the two respective parts of the word line 50, the two parts of the word line 50 jointly transmit signals on the word line, that is, the word line 50 is in contact with the first semiconductor pillar 01 through both the first gate structure 10 and the second gate structure 20. In this way, the contact area between the word line 50 and the semiconductor pillar 01 is increased, and the contact resistance between the word line 50 and the semiconductor pillar 01 is reduced, thereby improving the electrical stability of the word line 50 and improving the control ability of the word line 50 to the first transistor and the second transistor.

In some embodiments of the present disclosure, as shown in FIG. 4, the semiconductor structure 80 further includes: a bit line 51. The bit line 51 is located in the substrate 00, and is electrically connected with a bottom of the semiconductor pillar 01.

In the embodiment of the present disclosure, in combination with FIG. 3 and FIG. 4, the bit line 51 extends in the first direction X. The substrate 00 may further include metal silicide structures 02 (i.e., regions each surrounded by a circular dotted line frame). The metal silicide structures 02 are connected to form the bit line 51 electrically connected with the bottom of the first semiconductor pillar 01.

In the embodiment of the present disclosure, the material for forming the metal silicide structure 02 includes at least one of cobalt silicide, nickel silicide, molybdenum silicide, titanium silicide, tungsten silicide, tantalum silicide, or platinum silicide.

It is understandable that, compared with an un-metallized semiconductor material, the metal silicide structure 02 has a relatively small resistivity, which is beneficial to reduce the resistance of the bit line 51 and reduce the contact resistance between the bit line 51 and the first semiconductor pillar 01, thereby further improving the electrical performance of the semiconductor structure 80.

In the embodiment of the present disclosure, as shown in FIG. 3 and FIG. 4, the bottom of the first semiconductor pillar 01 is used as the source or the drain of the first transistor, and may be electrically connected with the bit line 51. The first gate structures 10, which are used as the gates of the first transistors, and the second gate structures 20, which are used as the gates of the second transistors, may be connected in series by the word line 50 respectively. The top of the semiconductor pillar 01 is used as the source or drain of the second transistor, which may be electrically connected with a subsequently formed capacitor structure.

Figure 5:
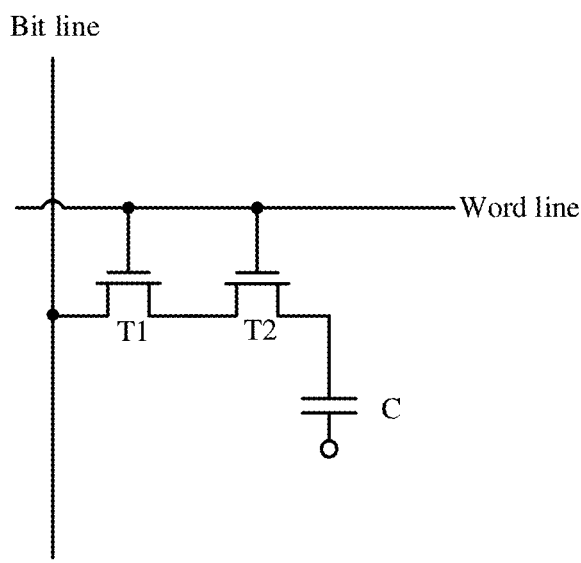
FIG. 5 is a fifth schematic diagram of a semiconductor structure provided by an embodiment of the present disclosure.

Thus, the semiconductor structure 80 may form a circuit as exemplified in FIG. 5, the source or the drain of the first transistor T1 is connected with the bit line, the drain or the source of the second transistor T2 is connected with a capacitor C, and the gates of the first transistor T1 and the second transistor T2 are both connected with the word line. In this way, a circuit structure of 2T-1C, that is, the circuit structure having two transistors and one capacitor, is formed, and may be used in the storage unit of a memory such as a Dynamic Random Access Memory (DRAM). In the circuit structure of 2T-1C, the word line may be in contact with the semiconductor pillar through both the gate of the first transistor T1 and the gate of the second transistor T2, so that the contact area between the word line and the semiconductor pillar is larger, and the contact resistance is smaller. Therefore, the electrical stability is higher, the control ability of the word line on the first transistor T1 and the second transistor T2 is better, and the electric leakage of the transistor is reduced.

Figure 6:
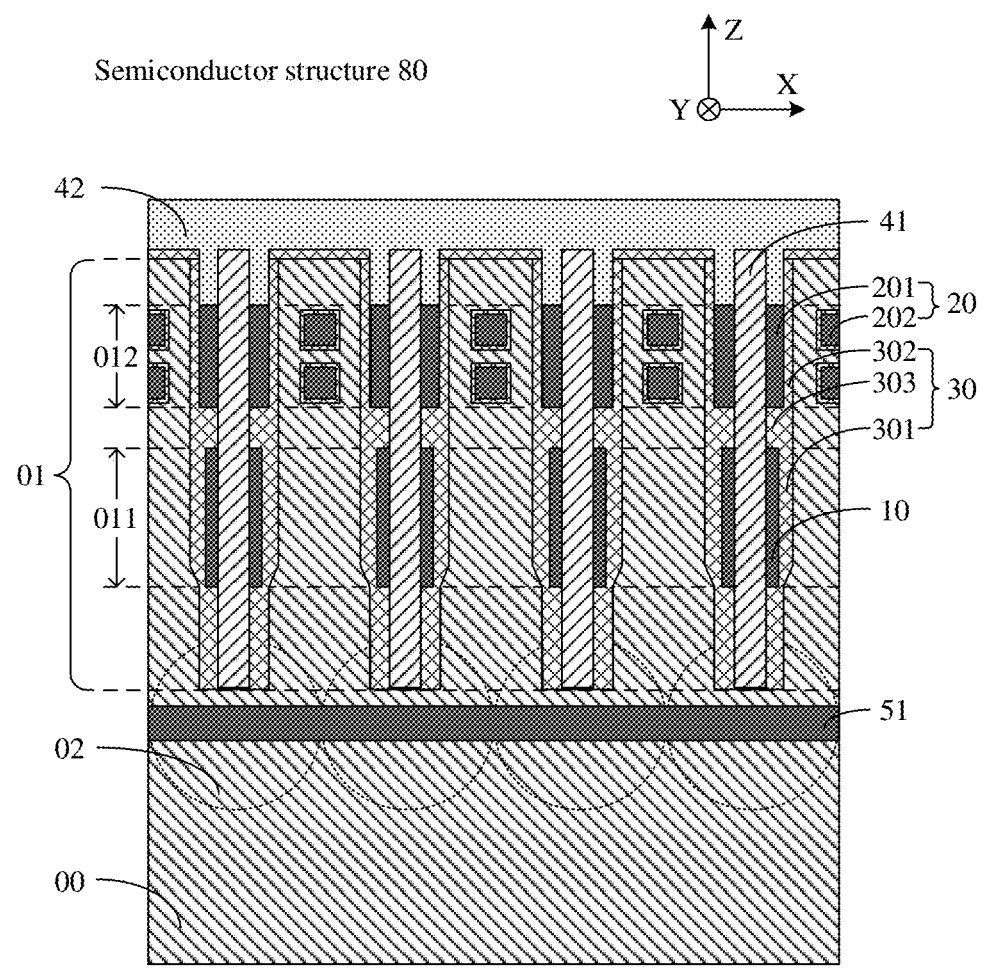
FIG. 6 is a sixth schematic diagram of a semiconductor structure provided by an embodiment of the present disclosure.

In some embodiments of the present disclosure, as shown in FIG. 6, the semiconductor structure 80 further includes: a covering layer 42. The covering layer 42 covers tops of the semiconductor pillar 01, the ring structure 201 and the first isolation layer 41. The covering layer 42 is an insulating material, which may protect the ring structure 201 to avoid short circuit.

Figure 7:
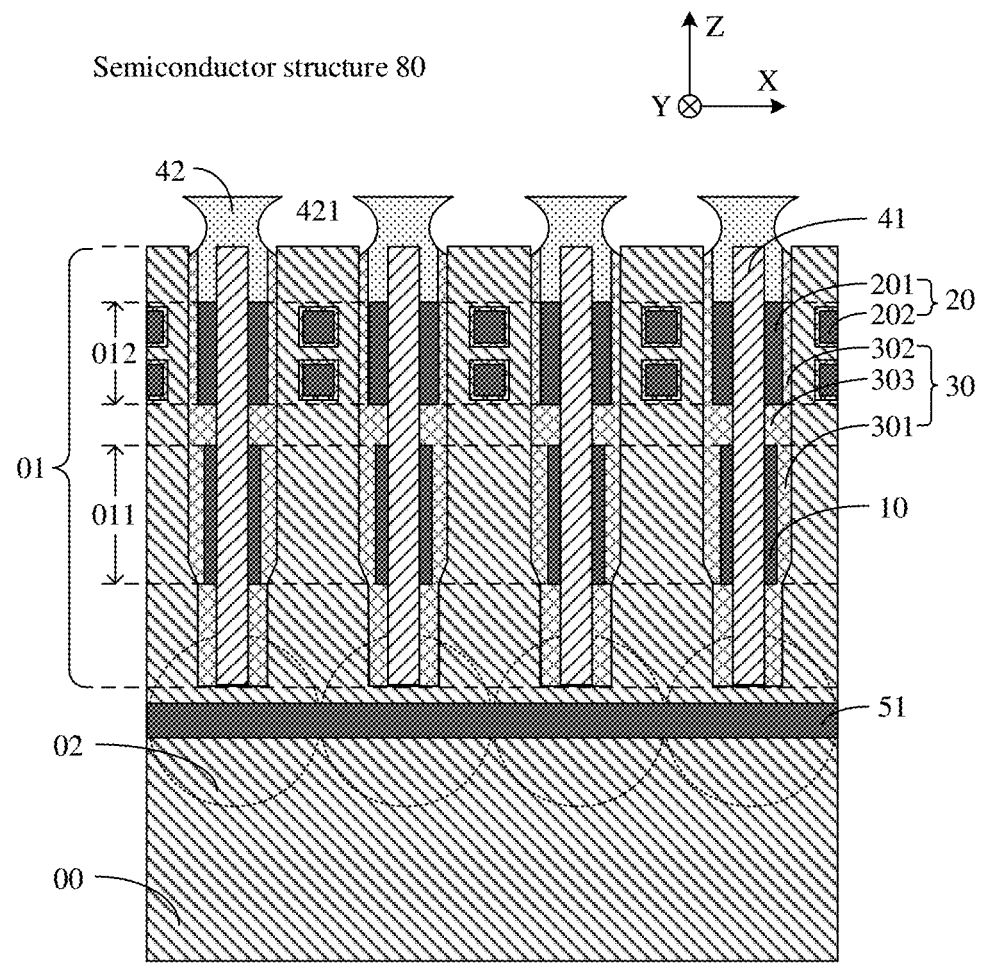
FIG. 7 is a seventh schematic diagram of a semiconductor structure provided by an embodiment of the present disclosure.

In some embodiments of the present disclosure, as shown in FIG. 7, the covering layer 42 may be processed to form a capacitor contact hole 421. In a subsequent process, a contact electrode may be formed in the capacitor contact hole 421 to electrically connect the semiconductor pillar 01 to the capacitor.

In some embodiments of the present disclosure, a top of the capacitor contact hole 421 is higher than the top of the semiconductor pillar 01, so that the contact electrodes may be isolated from each other. The capacitor contact hole 421 is formed by etching the covering layer 42 according to a mask, and the material forming the covering layer 42 may be silicon boron nitride ($SiB_xN_y$), where a ratio of x to y represents a ratio of the number of boron atoms in the silicon boron nitride to the number of nitrogen atoms in the silicon boron nitride, and $4 \geq y > x > 0$, $y-x \leq 2$. In some embodiments, when the silicon nitride is formed, the boron element is introduced into a cavity, thereby forming the silicon boron nitride, and, by controlling a flow ratio of the nitrogen atoms to the boron atoms, the ratio of the number of the boron atoms to the number of the nitrogen atoms in the silicon boron nitride may be adjusted. In the embodiments, since the silicon boron nitride is easier to be etched than the silicon nitride, and the boron atoms are doped into the silicon nitride, so that the stress of the silicon nitride may be reduced, that is, the stress of the silicon boron nitride is relatively small, the internal interaction force thereof is relatively small, and it is not easy to cause structural damage, thereby improving the device performance. When the difference between the number of the nitrogen atoms and the number of the boron atoms is smaller than or equal to 2, the content of the nitrogen atoms in the silicon boron nitride may be increased, thereby increasing the etch rate of the silicon boron nitride, and the stress of the silicon boron nitride is relatively small. If the difference between the number of the nitrogen atoms and the number of the boron atoms is greater than 2, the content of the boron atoms in the silicon boron nitride is relatively low, the etch rate of the silicon boron nitride is relatively low, and the stress of the silicon boron nitride is relatively large. In some embodiments, the silicon boron nitride is $SiB_2N_4$ or $SiB_{2.6}N_4$. It is to be noted that the representation method of $SiB_xN_y$ does not mean that the number of the silicon atoms is 1.

Referring to FIG. 7, due to the larger etch rate of the covering layer 42, the middle width of the capacitor contact hole 421 may be set to be larger, which is beneficial to increase the surface area of the electrode plate and increase the capacitance.

It is understandable that, referring to FIG. 7, the covering layer 42 is etched below the top of the semiconductor pillar 01, so that the capacitor contact hole 421 may expose the top of the semiconductor pillar 01 and part of the sidewall of the semiconductor pillar close to the top. In this way, the contact area between the semiconductor pillar 01 and the subsequently formed contact electrodes is increased, thereby reducing the contact resistance and improving the electrical performance. At the same time, the diameter of a middle portion of the capacitor contact hole 421 is larger than the diameter of a top or bottom portion thereof. Correspondingly, a middle section of the contact electrode formed in the capacitor contact hole 421 is enlarged, so that the resistance is reduced.

Figure 8:
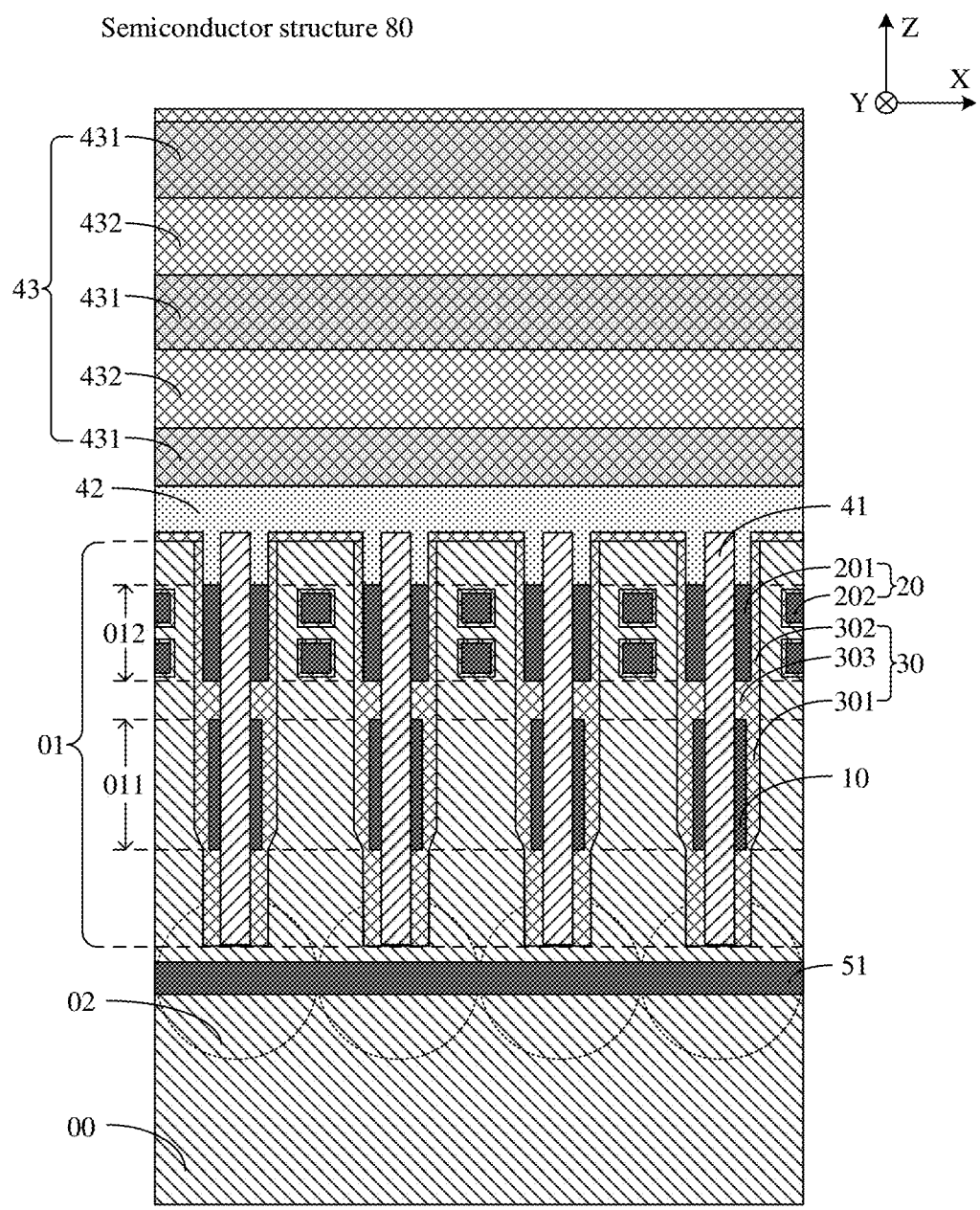
FIG. 8 is an eighth schematic diagram of a semiconductor structure provided by an embodiment of the present disclosure.

In some embodiments of the present disclosure, as shown in FIG. 8, the semiconductor structure 80 further includes: a first sacrificial structure 43. The first sacrificial structure 43 is located above the covering layer 42. The first sacrificial structure 43 includes additional doping regions 431 and body regions 432 which are alternately arranged in the vertical direction Z. The doping concentration in the additional doping region 431 is higher than the doping concentration in the body region 432. For example, if the material for forming the first sacrificial structure 43 is Boro-phospho-silicate Glass (BPSG) doped with the boron element, the boron content in the additional doping region 431 is higher than the boron content in the body region 432. Of course, in some embodiments, the body region 432 may also be un-doped BPSG.

In the embodiment of the present disclosure, an Ion Implantation (IMP) process may be used to dope the first sacrificial structure 43 to form the additional doping region 431. IMP is controlled by adopting different energies, so that regions with different depths in the first sacrificial structure 43 may be doped, thereby forming the alternately arranged additional doping regions 431 and body regions 432 as shown in FIG. 8.

Figure 9:
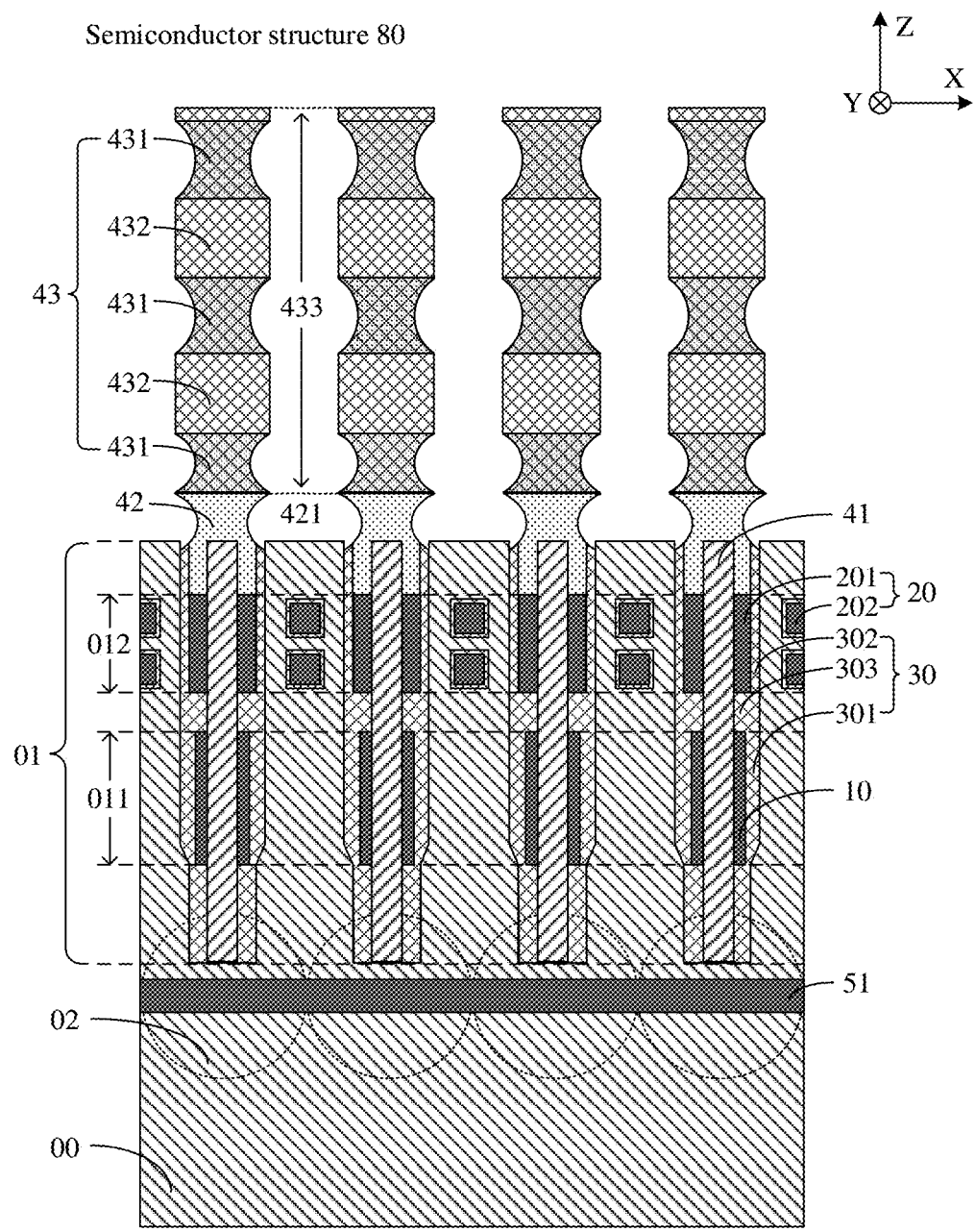
FIG. 9 is a ninth schematic diagram of a semiconductor structure provided by an embodiment of the present disclosure.

In some embodiments of the present disclosure, as shown in FIG. 9, the first sacrificial structure 43 may be processed to form a capacitor hole 433. In the subsequent process, a capacitor may be formed in the capacitor hole 433, and the capacitor is electrically connected to the semiconductor pillar 01.

In the embodiment of the present disclosure, the capacitor hole 433 is formed by etching according to the mask. Since the doping concentration of the boron in the additional doping region 431 is higher than the doping concentration of the boron in the body region 432, the additional doping region 431 is easier to be etched than the body region 432, and the additional doping region 431 is easier to form an isotropic etched structure. Referring to FIG. 9, the diameter of the capacitor hole 433 in the additional doping region 431 is larger than that in the body region 432, so that the cross-sectional profile of the inner sidewall of the capacitor hole 433 is wavy. It is understandable that, due to the electrode plate of the capacitor formed in the capacitor hole 433 covers the inner sidewall of the capacitor hole 433, the inner sidewall of the capacitor hole 433 with the wavy cross-sectional profile may increase the area of the electrode plate of the capacitor, thereby increasing the capacity of the capacitor.

At the same time, the capacitor formed in the capacitor hole 433 is electrically connected with the semiconductor pillar 01 through the contact electrode, the contact electrode may be formed in the capacitor contact hole 421, and the capacitor contact hole 421 may expose the top of the semiconductor pillar 01 and part of the sidewall of the semiconductor pillar close to the top, so that the contact area between the semiconductor pillar 01 and the contact electrode is increased, thereby reducing the contact resistance and improving the electrical performance.

The embodiments of the present disclosure further provide a method for manufacturing a semiconductor structure, which includes S101 to S105 and may be described in combination with each step.

It is to be noted that, FIGS. 10 to 19 are partial structural diagrams of a semiconductor structure in steps, which are intended to describe and clearly illustrate the steps of the method for manufacturing the semiconductor structure, and FIGS. 10 to 19 are cross-sectional views. A first direction X and a second direction Y shown in FIGS. 10 to 19 are both perpendicular to a vertical direction Z shown in FIG. 2. The first direction X and the second direction Y may be perpendicular to each other, and may also be at any included angle, and the following is exemplarily illustrated in a case where the first direction X is perpendicular to the second direction Y.

Figure 10:
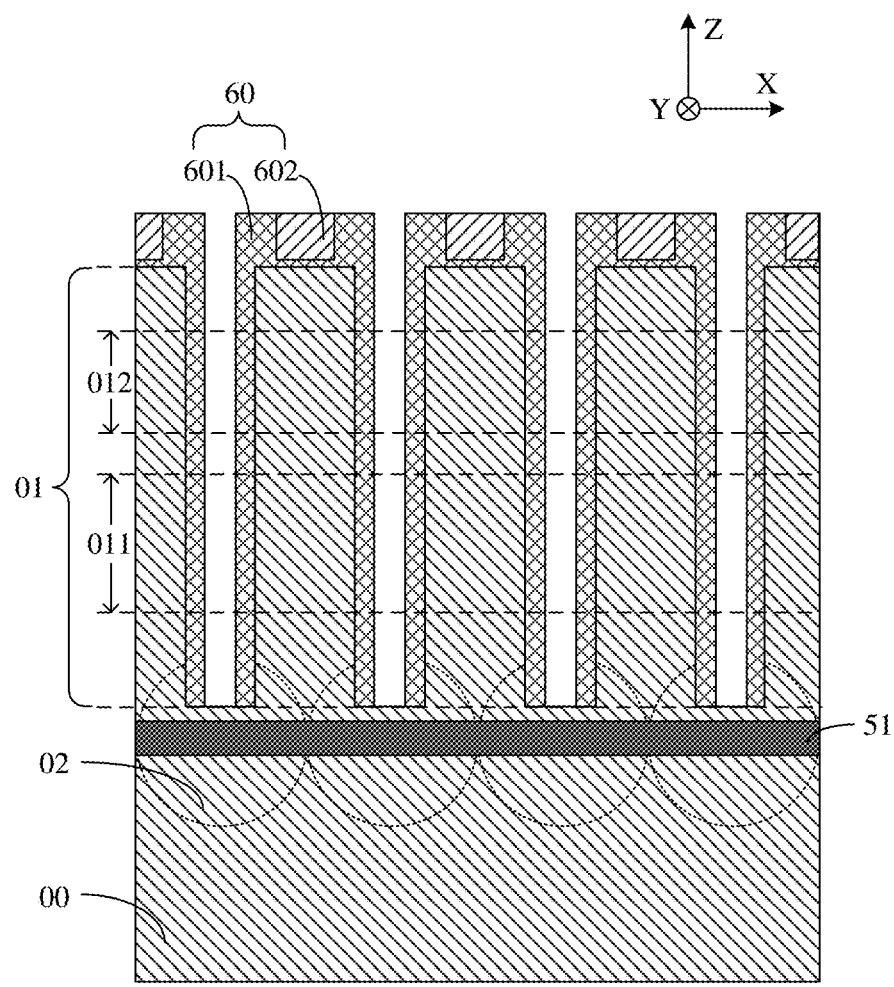
FIG. 10 is a first schematic diagram of a method for manufacturing a semiconductor structure provided by an embodiment of the present disclosure.

At S101, a substrate is provided. As shown in FIG. 10, the substrate 00 includes discrete semiconductor pillars 01. The semiconductor pillars 01 are arranged at a top of the substrate 00 and extend in a vertical direction Z. The semiconductor pillar 01 includes a first region 011 and a second region 012.

In the embodiment of the present disclosure, the substrate 00 may include at least one of semiconductor materials, for example, group IV elements such as silicon (Si), germanium (Ge), and silicon germanium (SiGe), or group III-V compounds such as gallium arsenide (GaAs), aluminum gallium arsenide (AlGaAs), indium arsenide (InAs), or indium gallium arsenide (InGaAs), and the following is exemplarily illustrated with the silicon element included in the substrate 00.

The semiconductor pillar 01 may have a doping element to improve the conductivity of the semiconductor pillar 01. Herein, the doping element may be a P-type doping element or an N-type doping element, and the N-type doping element may be at least one of an arsenic (As) element, a phosphorus (P) element, or an antimony (Sb) element. The P-type doping element may be at least one of a boron (B) element, an indium (In) element, or a gallium (Ga) element.

In the embodiment of the present disclosure, referring to FIG. 10, the substrate 00 is further provided with a bit line 51, and the bit line 51 extends in the first direction X. The substrate 00 further includes metal silicide structures 02 (i.e., regions each surrounded by a circular dotted line frame). The metal silicide structures 02 are connected to form the bit line 51. The bottom of the semiconductor pillar 01 is electrically connected with the bit line 51. The material for forming the metal silicide structure 02 includes at least one of cobalt silicide, nickel silicide, molybdenum silicide, titanium silicide, tungsten silicide, tantalum silicide, or platinum silicide.

Referring to FIG. 10, the semiconductor pillar 01 is also covered with a mask layer 60, a first part 601 of the mask layer 60 covers a sidewall and a top of the semiconductor pillar 01, and the middle of the first part 601 is filled with a second part 602 of the mask layer 60. The materials for forming the first part 601 and the second part 602 of the mask layer 60 are different, for example, the material for forming the first part 601 is silicon oxide, and the material for forming the second part 602 is silicon nitride. In this way, in combination with FIG. 11 and FIG. 12, etching may be performed according to a certain selection ratio, where only the second part 602 and part of the semiconductor pillar 01 covered by the second part are removed, and a groove 61 is formed in the middle of the semiconductor pillar 01. FIG. 13 is a top view of a single semiconductor pillar 01. As shown in FIG. 13, the groove 61 extends in the second direction Y and penetrates through the semiconductor pillar 01.

Figure 11:
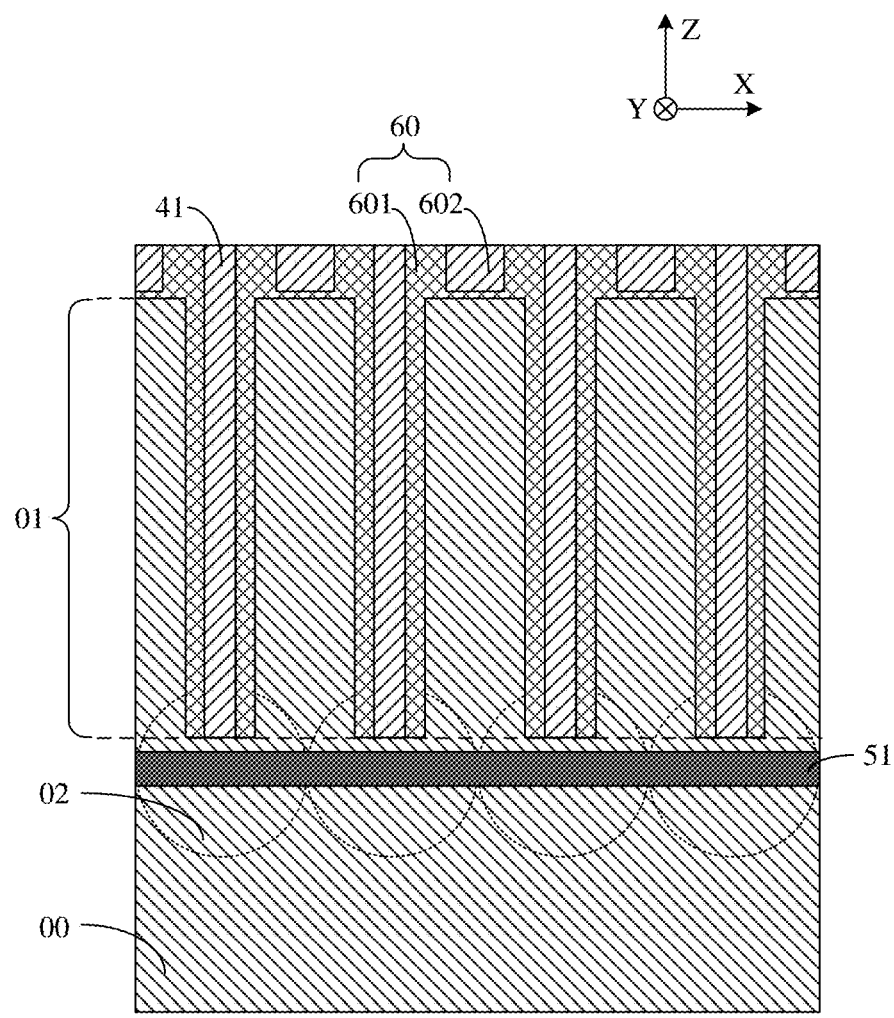
FIG. 11 is a second schematic diagram of a method for manufacturing a semiconductor structure provided by an embodiment of the present disclosure.

In the embodiment of the present disclosure, referring to FIG. 11, before the groove 61 is formed by etching, a first isolation layer 41 may be deposited. The first isolation layer 41 extends in the second direction Y to isolate the adjacent semiconductor pillars 01. The material for forming the first isolation layer 41 may be silicon nitride.

Figure 12:
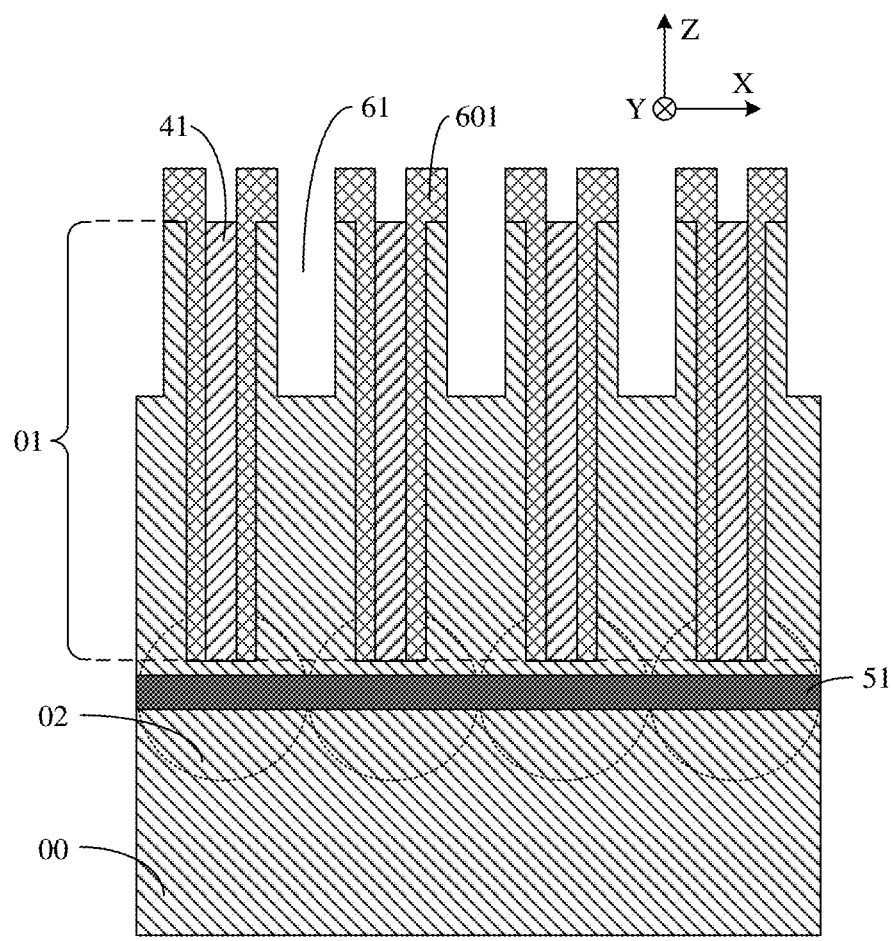
FIG. 12 is a third schematic diagram of a method for manufacturing a semiconductor structure provided by an embodiment of the present disclosure.
Figure 13:
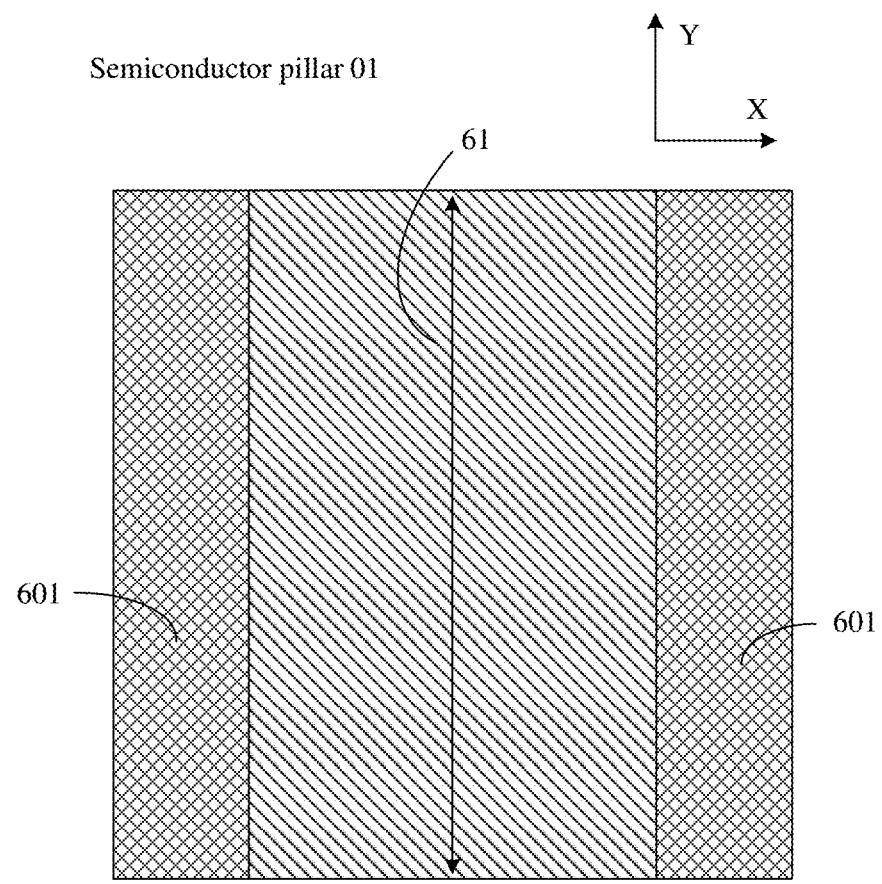
FIG. 13 is a fourth schematic diagram of a method for manufacturing a semiconductor structure provided by an embodiment of the present disclosure.
Figure 14:
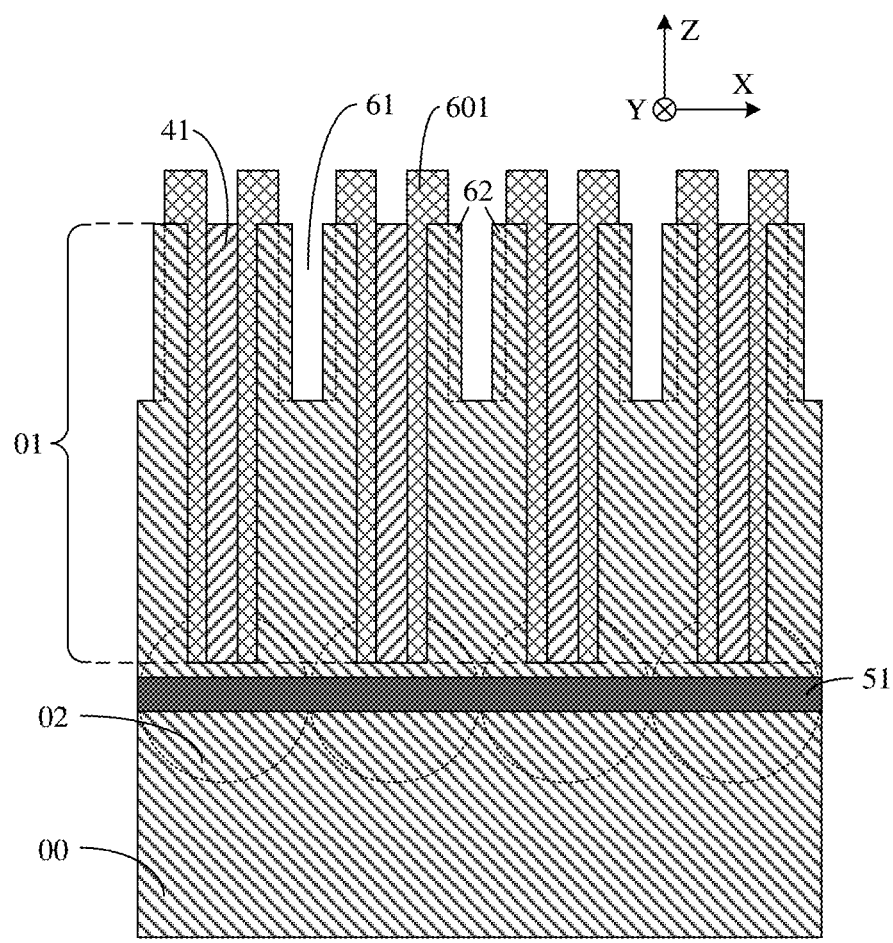
FIG. 14 is a fifth schematic diagram of a method for manufacturing a semiconductor structure provided by an embodiment of the present disclosure.

In the embodiment of the present disclosure, in combination with FIG. 12 and FIG. 14, after the groove 61 is formed by etching, an epitaxial layer 62 may be formed in an inner wall of the groove 61 to reduce a width of the groove 61, and repair the defects of the inner wall of the groove 61.

Figure 15:
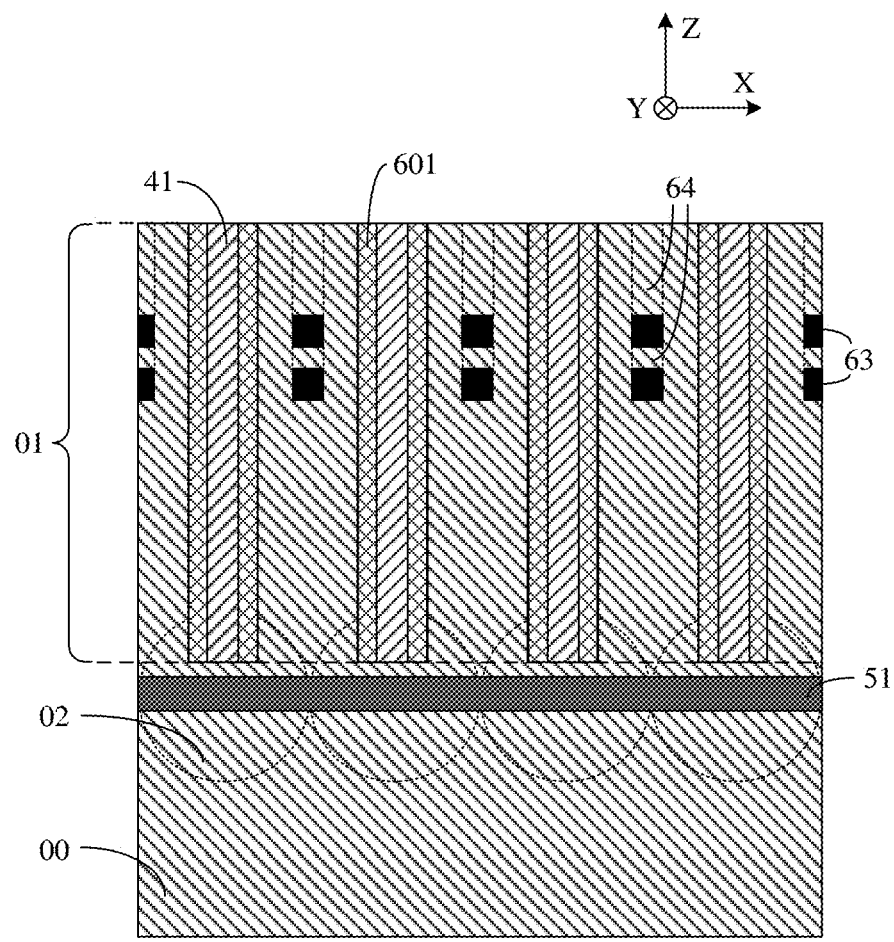
FIG. 15 is a sixth schematic diagram of a method for manufacturing a semiconductor structure provided by an embodiment of the present disclosure.

In the embodiment of the present disclosure, in combination with FIG. 14 and FIG. 15, after the groove 61 is formed, a sacrificial layer 63 may be formed in the groove 61. The material for forming the sacrificial layer 63 may be silicon germanium (SiGe), which is easily removed in the subsequent process, thereby providing a basis for forming a bridge structure in the second gate structure in the subsequent process.

Figure 16:
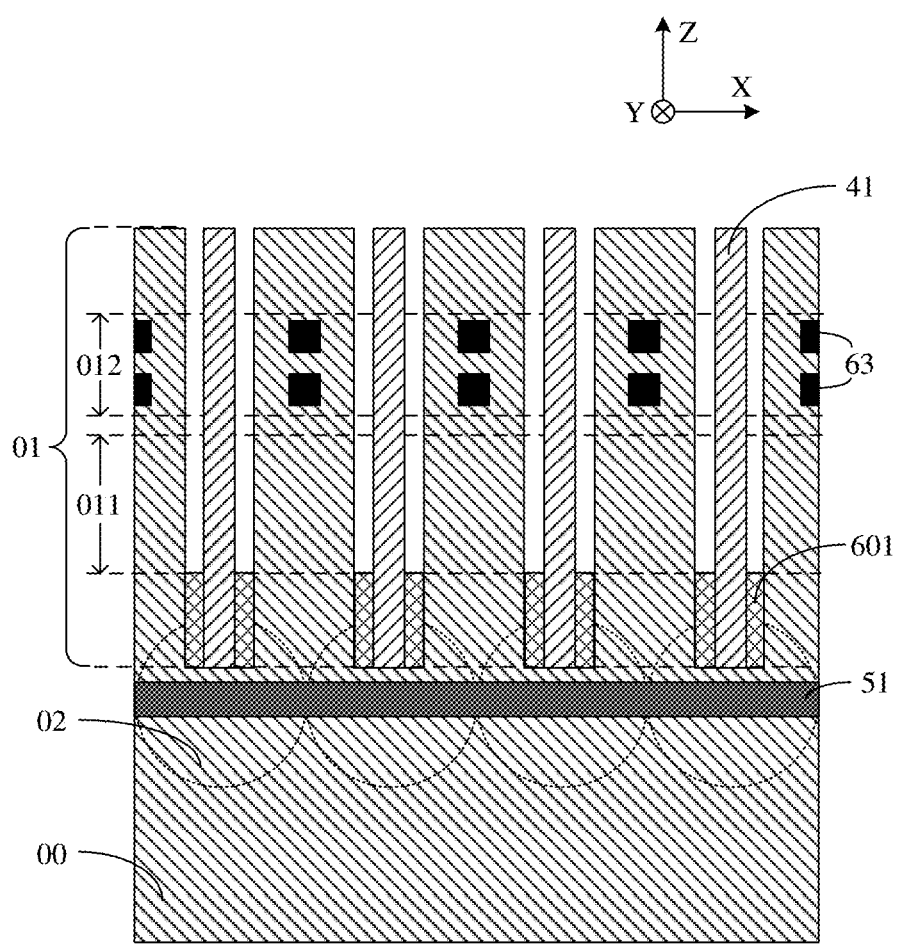
FIG. 16 is a seventh schematic diagram of a method for manufacturing a semiconductor structure provided by an embodiment of the present disclosure.

In the embodiment of the present disclosure, in combination with FIG. 11 and FIG. 16, the first part 601 of the mask layer 60 covering the sidewall of the semiconductor pillar 01 may be etched to the bottom of the first region 011 of the semiconductor pillar 01, as shown in FIG. 16. In this way, the sidewall, close to the bottom, of the semiconductor pillar 01 may be protected to avoid short circuit.

At S102, a first part of a dielectric layer is formed.

Figure 17:
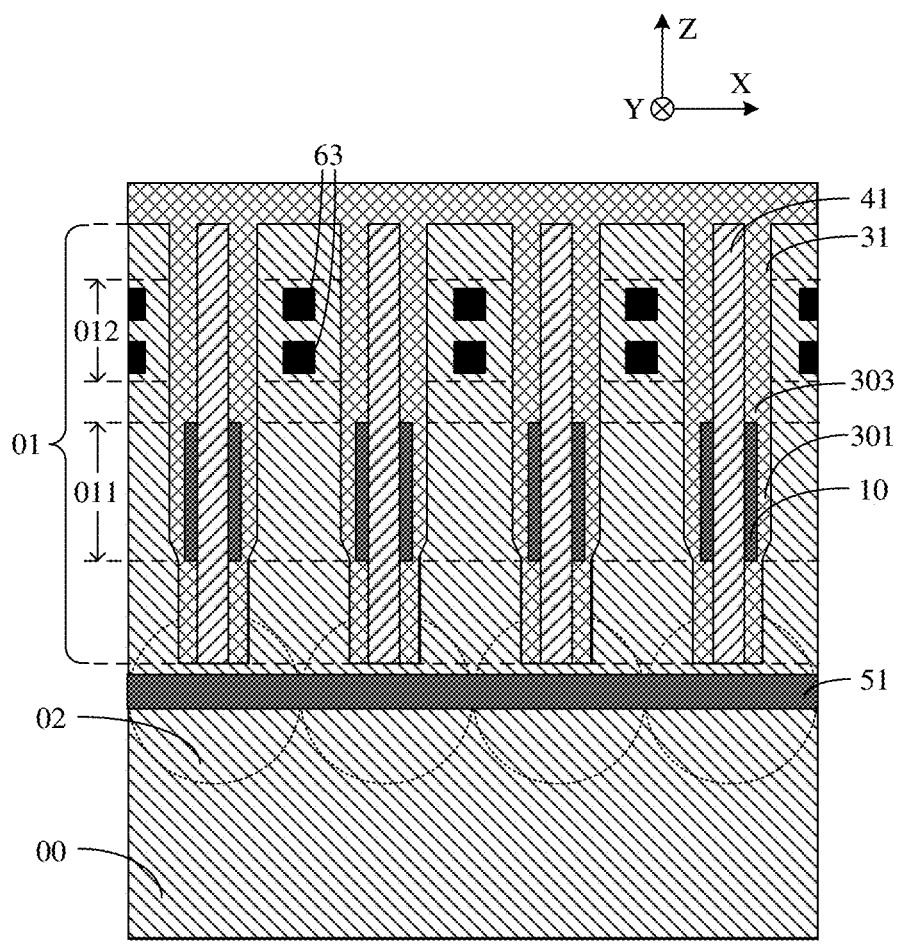
FIG. 17 is an eighth schematic diagram of a method for manufacturing a semiconductor structure provided by an embodiment of the present disclosure.

In the embodiment of the present disclosure, referring to FIG. 17, a Chemical Vapor Deposition (CVD) process may be adopted to deposit a first initial dielectric layer 31 on the sidewall of the semiconductor pillar 01. Herein, a part, located in the first region 011, of the first initial dielectric layer 31 forms the first part 301 of the dielectric layer. The material for forming the first initial dielectric layer 31 may be silicon oxide.

At S103, a first gate structure is formed in the first region of the semiconductor pillar.

In the embodiment of the present disclosure, referring to FIG. 17, a first gate layer may be deposited around the sidewall of the first initial dielectric layer 31, and the material for forming the first gate layer may be a conductive material such as titanium nitride. Then, the deposited first gate layer may be etched back, to etch back the first gate layer to the top of the first region 011, and the remaining first gate layer forms the first gate structure 10 shown in FIG. 17. The first gate structure 10 surrounds the semiconductor pillar 01, and the first part 301 of the dielectric layer is located between the first gate structure 10 and the semiconductor pillar 01.

At S104, a second part of the dielectric layer is formed.

Figure 18:
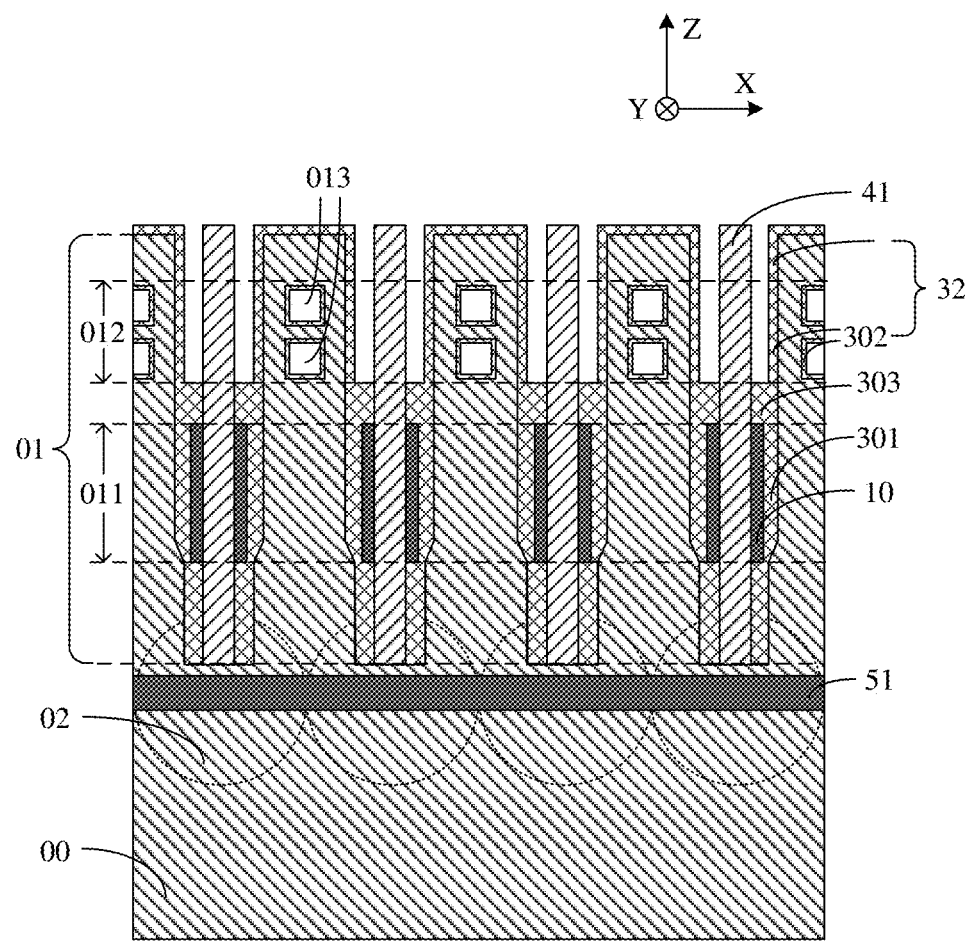
FIG. 18 is a ninth schematic diagram of a method for manufacturing a semiconductor structure provided by an embodiment of the present disclosure.

In the embodiment of the present disclosure, referring to FIG. 18, a thermal oxidation process may be adopted to form a second initial dielectric layer 32 on the sidewall of the semiconductor pillar 01 and the inner wall of a through hole 013. Herein, a part, located in the second region 012, of the second initial dielectric layer 32 forms the second part 302 of the dielectric layer 30. The material for forming the second initial dielectric layer 32 may be silicon oxide.

At S105, a second gate structure is formed in the second region of the semiconductor pillar.

Figure 19:
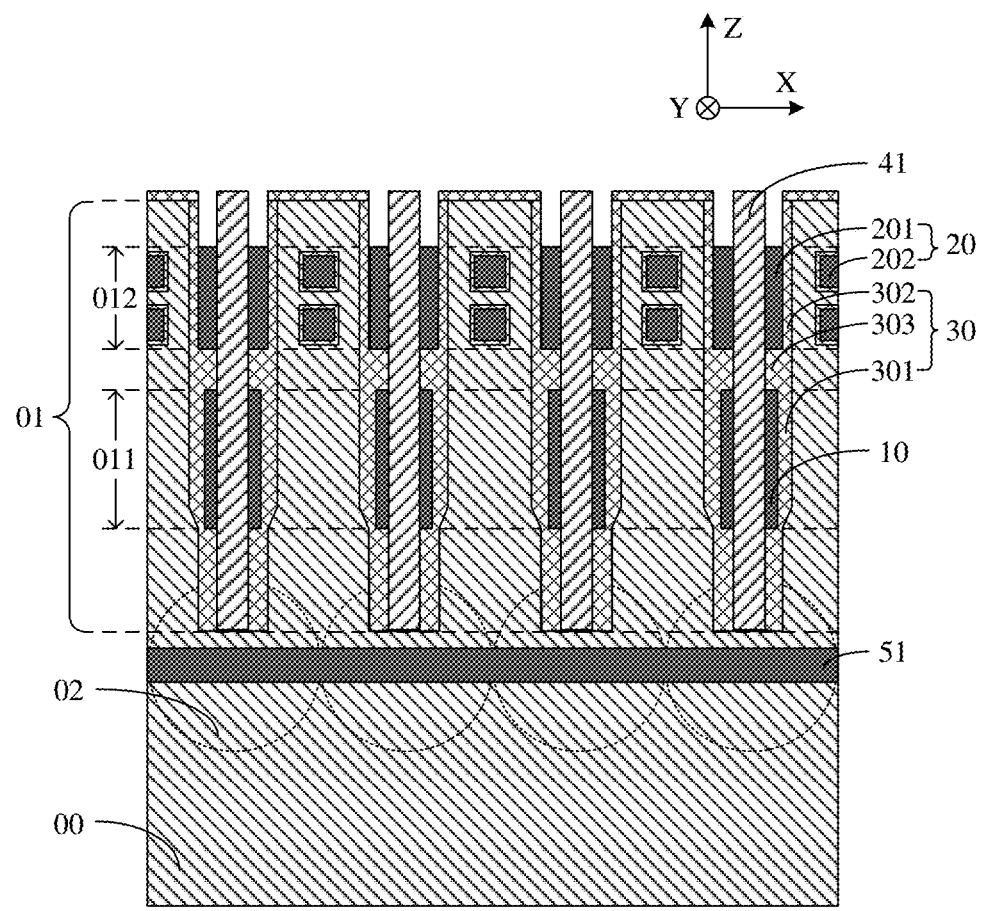
FIG. 19 is a tenth schematic diagram of a method for manufacturing a semiconductor structure provided by an embodiment of the present disclosure.

In the embodiment of the present disclosure, referring to FIG. 18 and FIG. 19, a second gate layer surrounding the sidewall of the second initial dielectric layer 32 and filling the through hole 013 may be formed. Herein, a part of the second gate layer for filling the through hole 013 forms the bridge structure 202, and the material for forming the second gate layer may be a conductive material such as titanium nitride. Then, a part of the second gate layer surrounding the sidewall of the second initial dielectric layer 32 may be etched back to the top of the second region 012, and the remaining second gate layer forms a ring structure 201. Thus, as shown in FIG. 19, the formed second gate structure 20 includes the ring structure 201 and at least one bridge structure 202. Herein, the ring structure 201 surrounds the semiconductor pillar 01, and the at least one bridge structure 202 penetrates through the semiconductor pillar 01 and extends to the inner wall of the ring structure 201 in a penetrating direction. The second part 302 of the dielectric layer 30 is located between the second gate structure 20 and the semiconductor pillar 01.

It is understandable that, the semiconductor pillar 01 and the first gate structure 10 may form a first transistor, the semiconductor pillar 01 and the second gate structure 20 may form a second transistor, and a gate of the first transistor and a gate of the second transistor may both receive control signals, and controlled structures are increased. At the same time, the second gate structure 20 includes the ring structure 201 surrounding the semiconductor pillar and the bridge structure 202 penetrating through the semiconductor pillar 01, so that the coverage area of the second gate structure 20 on the semiconductor pillar 01 is increased, and the control ability of the gate of the second transistor is improved, thereby reducing the electric leakage of the transistor. Thus, a semiconductor structure with higher electrical performance is formed.

In some embodiments of the present disclosure, in combination with FIG. 16 and FIG. 17, the operation that the first gate structure 10 is formed includes S201 to S204, and may be described in combination with each step.

At S201, part of the sidewall of the semiconductor pillar 01 is etched, so that the width of the first region 011 and the width of the second region 012 are both smaller than the width of the bottom of the semiconductor pillar 01.

In the embodiment of the present disclosure, before the first part 301 of the dielectric layer is formed, part of the sidewall of the semiconductor pillar 01 in FIG. 16 (i.e. part of the sidewall above the bottom of the first region 011) may be etched (such as by dry etching), so that the width of the first region 011 and the width of the second region 012 are both smaller than the width of the bottom of the semiconductor pillar 01, thereby providing a larger space for the subsequent formation of the first gate structure and even the second gate structure. The above widths may be the width in the first direction X.

At S202, a first initial dielectric layer 31 is formed on the sidewall of the semiconductor pillar 01.

In the embodiment of the present disclosure, the CVD process may be adopted to deposit the first initial dielectric layer 31 on the sidewall of the semiconductor pillar 01 in FIG. 16. Herein, the part, located in the first region 011, of the first initial dielectric layer 31 forms the first part 301 of the dielectric layer.

At S203, a first gate layer is formed around the sidewall of the first initial dielectric layer.

In the embodiment of the present disclosure, after the first initial dielectric layer 31 is formed, the first gate layer may be deposited around the sidewall of the first initial dielectric layer 31. The material for forming the first gate layer may be a conductive material such as titanium nitride.

At 204, the first gate layer is etched to form a first gate structure 10.

In the embodiment of the present disclosure, the deposited first gate layer may be etched back, so that the first gate layer may be etched back to the top of the first region 011, and the remaining first gate layer forms the first gate structure 10 shown in FIG. 17.

Referring to FIG. 17, after the first gate structure 10 is formed, a third part 303 of the dielectric layer may be deposited on the first gate structure 10, and the third part 303 of the dielectric layer is configured to isolate the first gate structure 10 from a second gate structure to be formed. The material for forming the third part 303 of the dielectric layer may be silicon oxide.

In some embodiments of the present disclosure, in combination with FIGS. 11 to 15, the operation that the second gate structure 20 is formed includes S301 to S303, and may be illustrated in combination with each step.

At S301, a groove 61 is formed in the semiconductor pillar 01.

In the embodiment of the present disclosure, as shown in FIG. 11 and FIG. 12, the middle of the first part 601 is filled with the second part 602 of the mask layer 60, and etching is performed according to the mask layer 60 to form the groove 61 in the middle of the semiconductor pillar 01. FIG. 13 is a top view of the single semiconductor pillar 01. As shown in FIG. 13, the groove 61 extends in the second direction Y and penetrates through the semiconductor pillar 01.

In the embodiment of the present disclosure, referring to FIG. 11, the first isolation layer 41 may also be deposited before the groove 61 is formed by etching. The first isolation layer 41 extends in the second direction Y to isolate the adjacent semiconductor pillars 01. The material for forming the first isolation layer 41 may be silicon nitride.

In the embodiment of the present disclosure, referring to FIG. 14, after the groove 61 is formed by etching, the epitaxial layer 62 may be formed on the inner wall of the groove 61 to reduce the width of the groove 61. It is understandable that, since the smaller the size of the mask pattern, the greater the difficulty of the process, the etching is first performed according to the second part 602 of the wider mask layer, and then the epitaxial layer 62 is formed to reduce the width of the groove 61. In this way, a small-size groove is formed with a large-size mask pattern, which reduces the difficulty of the process.

At the same time, in the process of forming the groove 61 by etching, defects and damages may be brought to the inner wall of the groove 61, and the epitaxial layer 62 may also repair the defects and damages on the inner wall of the groove 61, thereby reducing the defects of the semiconductor pillar 01 and improving the performance of the formed semiconductor structure.

At S302, a sacrificial layer 63 is formed in the groove 61.

In the embodiment of the present disclosure, in combination with FIG. 14 and FIG. 15, after the groove 61 is formed, the sacrificial layer 63 may be formed in the groove 61. The material for forming the sacrificial layer 63 may be silicon germanium (SiGe), which is easily removed in the subsequent process.

At S303, a filling layer 64 on the sacrificial layer 63 is formed in the groove.

In the embodiment of the present disclosure, if the second gate structure to be formed only includes one bridge structure, the remaining groove 61 is directly filled with the filling layer 64 formed on the sacrificial layer 63. If the second gate structure to be formed includes at least two bridge structures, after one filling layer 64 is formed on the sacrificial layer 63, the sacrificial layer 63 and the filling layer 64 are continued to be formed in the groove 61 in sequence, and finally the groove 61 is filled with the filling layer 64 until the top of the groove. As shown in FIG. 14 and FIG. 15, two sacrificial layers 63 and two filling layers 64 are formed in the groove 61. The sacrificial layers 63 and the filling layers 64 are alternately stacked, and finally the groove 61 is filled with the filling layer 64 until the top of the groove.

It is understandable that, the sacrificial layer 63 and the filling layer 64 are formed in the groove 61 in sequence, which provides a basis for forming the bridge structure in the second gate structure in the subsequent process.

In the embodiment of the present disclosure, in combination with FIGS. 17 to 19, the operation that the second gate structure 20 is formed includes S304 to S307, and may be illustrated in combination with each step.

At S304, the sacrificial layer 63 is removed to form a through hole 013. The through hole 013 penetrates through the semiconductor pillar 01.

In the embodiment of the present disclosure, referring to FIG. 17 and FIG. 18, the first initial dielectric layer 31 in FIG. 17 may be etched first until it is be etched to the bottom of the second region 012. Then, a wet etch process is adopted to remove the sacrificial layer 63 filled in the semiconductor pillar 01, so as to form the through hole 013 in FIG. 18.

At S305, a second initial dielectric layer 32 is formed on the sidewall of the semiconductor pillar 01 and the inner wall of the through hole 013.

In the embodiment of the present disclosure, referring to FIG. 18, a thermal oxidation process may be adopted to form the second initial dielectric layer 32 on the sidewall of the semiconductor pillar 01 and the inner wall of the through hole 013. Herein, a part, located in the second region 012, of the second initial dielectric layer 32 forms the second part 302 of the dielectric layer 30.

At S306, a second gate layer surrounding the sidewall of the second initial dielectric layer and filling the through hole is formed.

In the embodiment of the present disclosure, referring to FIG. 18 and FIG. 19, after the second initial dielectric layer 32 is formed, the second gate layer surrounding the sidewall of the second initial dielectric layer 32 and filling the through hole 013 may be formed. Herein, the part of the second gate layer for filling the through hole 013 forms the bridge structure 202. The material for forming the second gate layer may be a conductive material such as titanium nitride.

At S307, the part of the second gate layer surrounding the sidewall of the second initial dielectric layer is etched to form a ring structure.

In the embodiment of the present disclosure, referring to FIG. 18 and FIG. 19, the part of the second gate layer surrounding the sidewall of the second initial dielectric layer 32 may be etched back to the top of the second region 012, and the remaining second gate layer forms the ring structure 201.

It is to be noted that, in the present disclosure, terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Under the condition of no more limitations, an element defined by the statement "including a/an" does not exclude existence of the same other elements in a process, method, object or device including the element.

The sequence numbers of the embodiments of the present disclosure are adopted not to represent superiority-inferiority of the embodiments but only for description. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiments. The features disclosed in several method or device embodiments provided in the present disclosure may be combined arbitrarily without conflict to obtain new method embodiments or device embodiments.

The above description is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

INDUSTRIAL APPLICABILITY

Embodiments of the present disclosure provide a semiconductor structure and a method for manufacturing the same. The semiconductor structure includes: a substrate, a dielectric layer, a first gate structure, and a second gate structure. Herein, the substrate includes discrete semiconductors arranged at a top of the substrate and extending in a vertical direction. The semiconductor pillar includes a first region and a second region. The dielectric layer covers the semiconductor pillar. The first gate structure is arranged in the first region of the semiconductor pillar and surrounds the semiconductor pillar. A first part of the dielectric layer is located between the first gate structure and the semiconductor pillar. The second gate structure is arranged in the second region of the semiconductor pillar and includes a ring structure and at least one bridge structure. The ring structure surrounds the semiconductor pillar, and the at least one bridge structure penetrates through the semiconductor pillar and extends to the inner wall of the ring structure in a penetrating direction. The second part of the dielectric layer is located between the second gate structure and the semiconductor pillar. In this way, the semiconductor pillar and the first gate structure may form a first transistor, the semiconductor pillar and the second gate structure may form a second transistor, and a gate of the first transistor and a gate of the second transistor may both receive control signals, and controlled structures are increased. At the same time, the second gate structure includes the ring structure surrounding the semiconductor pillar and the bridge structure penetrating through the semiconductor pillar, so that the coverage area of the second gate structure on the semiconductor pillar is increased, and the control ability of the gate of the second transistor is improved. Thus, the embodiments of the present disclosure improve the overall electrical performance of the semiconductor structure.

The invention claimed is:

1. A semiconductor structure, comprising:
   a substrate, comprising discrete semiconductor pillars arranged at a top of the substrate and extending in a vertical direction, the semiconductor pillar comprising a first region and a second region;
   a dielectric layer, covering the semiconductor pillar;
   a first gate structure, arranged in the first region of the semiconductor pillar and surrounding the semiconductor pillar, wherein a first part of the dielectric layer is located between the first gate structure and the semiconductor pillar; and
   a second gate structure, arranged in the second region of the semiconductor pillar and comprising a ring structure and at least one bridge structure, the ring structure surrounding the semiconductor pillar, and the at least one bridge structure penetrating through the semiconductor pillar and extending to an inner wall of the ring structure in a penetrating direction, wherein a second part of the dielectric layer is located between the second gate structure and the semiconductor pillar;
   wherein a thickness of the first part of the dielectric layer is greater than a thickness of the second part of the dielectric layer.

2. The semiconductor structure of claim 1, wherein a length of the ring structure in the vertical direction is smaller than a length of the first gate structure in the vertical direction.

3. The semiconductor structure of claim 1, wherein a thickness of the ring structure in the second region is greater than a thickness of the first gate structure in the first region.

4. The semiconductor structure of claim 1, wherein the second region is located above the first region, and a top of the ring structure is lower than a top of the semiconductor pillar.

5. The semiconductor structure of claim 1, wherein the dielectric layer further comprises a third part located between the first part of the dielectric layer and the second part of the dielectric layer, a thickness of the third part of the dielectric layer being greater than a thickness of the first part of the dielectric layer.

6. The semiconductor structure of claim 1, wherein the second gate structure comprises at least two bridge structures stacked in the vertical direction.

7. The semiconductor structure of claim 6, wherein a width of each of the at least two bridge structures is smaller than a width of the semiconductor pillar.

8. The semiconductor structure of claim 1, further comprising:
   a first isolation layer located between adjacent semiconductor pillars of the semiconductor pillars, wherein the first gate structure and the second gate structure are located between the first isolation layer and the semiconductor pillar.

9. The semiconductor structure of claim 1, further comprising:
   a bit line, located in the substrate, and electrically connected with a bottom of the semiconductor pillar.

10. A method for manufacturing a semiconductor structure, comprising:

providing a substrate, comprising discrete semiconductor pillars arranged at a top of the substrate and extending in a vertical direction, the semiconductor pillar comprising a first region and a second region;

forming a first part of a dielectric layer;

forming, in the first region of the semiconductor pillar, a first gate structure surrounding the semiconductor pillar, wherein the first part of the dielectric layer is located between the first gate structure and the semiconductor pillar;

forming a second part of the dielectric layer; and forming, in the second region of the semiconductor pillar, a second gate structure comprising a ring structure and at least one bridge structure, wherein the ring structure surrounds the semiconductor pillar, and the at least one bridge structure penetrates through the semiconductor pillar and extends to an inner wall of the ring structure in a penetrating direction; and the second part of the dielectric layer is located between the second gate structure and the semiconductor pillar;

wherein a thickness of the first part of the dielectric layer is greater than a thickness of the second part of the dielectric layer.

11. The manufacturing method of claim 10, wherein forming the first gate structure comprises:

etching part of a sidewall of the semiconductor pillar, so that a width of the first region and a width of the second region are both smaller than a width of a bottom of the semiconductor pillar;

forming a first initial dielectric layer on the sidewall of the semiconductor pillar, wherein a part, located in the first region, of the first initial dielectric layer forms the first part of the dielectric layer;

forming a first gate layer surrounding a sidewall of the first initial dielectric layer; and etching the first gate layer to form the first gate structure.

12. The manufacturing method of claim 10, wherein, if the second gate structure comprises one bridge structure, forming the second gate structure comprises:

forming a groove in the semiconductor pillar;

forming a sacrificial layer in the groove; and forming a filling layer in the groove, wherein the filling layer is located on the sacrificial layer, and the remaining groove is fully filled with the filling layer.

13. The manufacturing method of claim 12, wherein forming the second gate structure further comprises:

removing the sacrificial layer to form a through hole penetrating through the semiconductor pillar;

forming a second initial dielectric layer on a sidewall of the semiconductor pillar and an inner wall of the through hole, wherein a part, located in the second region, of the second initial dielectric layer forms the second part of the dielectric layer;

forming a second gate layer surrounding a sidewall of the second initial dielectric layer and filling the through hole, wherein a part of the second gate layer for filling the through hole forms the bridge structure; and etching a part of the second gate layer surrounding the sidewall of the second initial dielectric layer to form the ring structure.

14. The manufacturing method of claim 10, wherein, if the second gate structure comprises at least two bridge structures, forming the second gate structure comprises:

forming a groove in the semiconductor pillar;

forming a sacrificial layer in the groove;

forming in the groove a filling layer located on the sacrificial layer; and forming further the sacrificial layer and the filling layer in the groove in sequence, so that the groove is finally filled with the filling layer until a top of the groove.

15. The manufacturing method of claim 14, wherein forming the second gate structure further comprises:

removing the sacrificial layers to form through holes penetrating through the semiconductor pillar;

forming a second initial dielectric layer on a sidewall of the semiconductor pillar and inner walls of the through holes, wherein a part, located in the second region, of the second initial dielectric layer forms the second part of the dielectric layer;

forming a second gate layer surrounding a sidewall of the second initial dielectric layer and filling the through holes, wherein parts of the second gate layer for filling the through holes form the bridge structures; and etching a part of the second gate layer surrounding the sidewall of the second initial dielectric layer to form the ring structure.

16. A semiconductor structure, comprising:

a substrate, comprising discrete semiconductor pillars arranged at a top of the substrate and extending in a vertical direction, the semiconductor pillar comprising a first region and a second region;

a dielectric layer, covering the semiconductor pillar;

a first gate structure, arranged in the first region of the semiconductor pillar and surrounding the semiconductor pillar, wherein a first part of the dielectric layer is located between the first gate structure and the semiconductor pillar; and a second gate structure, arranged in the second region of the semiconductor pillar and comprising a ring structure and at least one bridge structure, the ring structure surrounding the semiconductor pillar, and the at least one bridge structure penetrating through the semiconductor pillar and extending to an inner wall of the ring structure in a penetrating direction, wherein a second part of the dielectric layer is located between the second gate structure and the semiconductor pillar;

wherein the second gate structure comprises at least two bridge structures stacked in the vertical direction.

17. The semiconductor structure of claim 16, wherein a width of each of the at least two bridge structures is smaller than a width of the semiconductor pillar.

18. The semiconductor structure of claim 16, wherein a length of the ring structure in the vertical direction is smaller than a length of the first gate structure in the vertical direction.

19. The semiconductor structure of claim 16, wherein a thickness of the ring structure in the second region is greater than a thickness of the first gate structure in the first region.

20. The semiconductor structure of claim 16, further comprising:

a first isolation layer located between adjacent semiconductor pillars of the semiconductor pillars, wherein the first gate structure and the second gate structure are located between the first isolation layer and the semiconductor pillar.

* * * * *